United States Patent [19]

Seiwa et al.

[11] Patent Number: 5,547,642

[45] Date of Patent: Aug. 20, 1996

[54] LIGHT OZONE ASHER, LIGHT ASHING METHOD, AND MANUFACTURING METHOD OF SEMICONDUCTOR DEVICE

[75] Inventors: Yoshito Seiwa; Toshiaki Kitano, both of Itami; Yasutaka Kohno deceased, late of Saijyo, Japan, by Yoko Kohno Legal Representor

[73] Assignee: Mitsubishi Denki Kabushiki Kaisha, Tokyo, Japan

[21] Appl. No.: 396,800

[22] Filed: Mar. 1, 1995

[30] Foreign Application Priority Data

Mar. 16, 1994 [JP] Japan .................................. 6-045600

[51] Int. Cl.[6] ..................... C23C 16/00; H01L 21/302
[52] U.S. Cl. ..................... 422/186.3; 422/906; 156/345; 156/643.1; 118/723 R; 204/192.32; 204/192.33; 216/63
[58] Field of Search ............................. 422/186.3, 907; 156/345, 643, 659.1, 626, 668, 627, 646; 118/723 R; 204/192.33, 192.32

[56] References Cited

U.S. PATENT DOCUMENTS

| | | | |
|---|---|---|---|
| 5,246,526 | 9/1993 | Yamaguchi et al. | 156/345 |
| 5,271,963 | 12/1993 | Eichman et al. | 427/248.1 |
| 5,350,454 | 9/1994 | Ohkawa | 118/723 R |
| 5,350,480 | 9/1994 | Gray | 156/345 |
| 5,380,503 | 1/1995 | Fojii et al. | 422/243 |
| 5,478,401 | 12/1995 | Tsunekawa et al. | 134/1 |

FOREIGN PATENT DOCUMENTS

| | | |
|---|---|---|
| 62-154736 | 7/1987 | Japan . |
| 62-295417 | 12/1987 | Japan . |
| 3261127 | 11/1991 | Japan . |
| 4127430 | 4/1992 | Japan . |

OTHER PUBLICATIONS

WPI Abstract Accession No. 94–246344/30 & JP 06/181200A (1994) (Babcock–Hitachi) Jun. 28, 1994.
WPI Abstract Accession No. 89–31425 1/43 & JP 01/233728A (1989) (Hitachi).
"Light Ashing Technique", Semicon News, 1988, Number 12, pp. 47–53.
"UV Light Source And The Application", Open Meeting, 1989, pp. 1–9.

Primary Examiner—Charles T. Jordan
Assistant Examiner—Daniel Jenkins
Attorney, Agent, or Firm—Leydig, Voit & Mayer

[57] ABSTRACT

A light/ozone asher includes a process chamber having a sample stage for supporting a sample processed with active oxygen generated by irradiating ozone with UV rays while not irradiating the sample with UV rays. Since the sample is not irradiated with UV rays when an organic substance on the sample surface is removed, an organic substance (scum) left by removal of parts of the organic substance on the sample is removed without destroying the remaining pattern of organic substance.

24 Claims, 20 Drawing Sheets

Prior Art

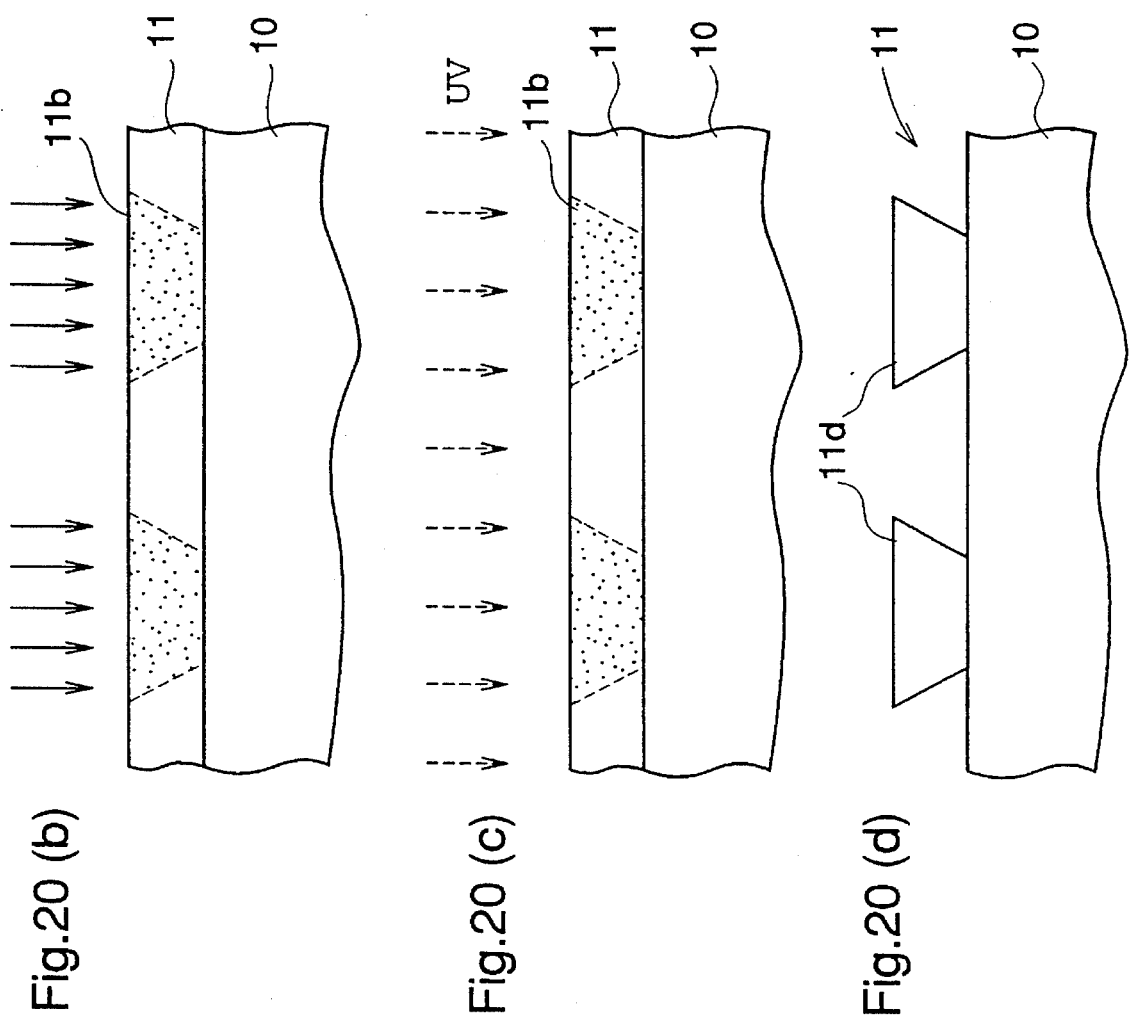
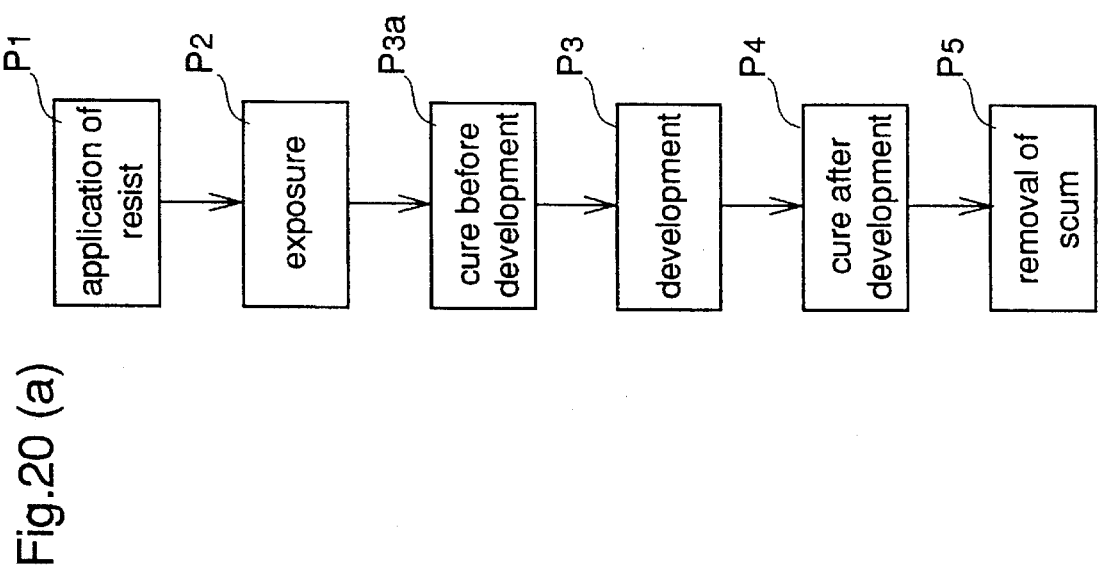

LIGHT OZONE ASHER, LIGHT ASHING METHOD, AND MANUFACTURING METHOD OF SEMICONDUCTOR DEVICE

BACKGROUND OF THE INVENTION

1. Field of the Invention

The present invention relates to a light/ozone asher and, more particularly, to a light/ozone asher in which a scum, that is, an organic residual generated after patterning of a resist or the like, is removed using UV rays and ozone. In addition, the present invention relates to a light ashing method and a manufacturing method of a semiconductor device.

2. Description of the Prior Art

FIGS. 15(a)–15(b) are a sectional view and a plan view illustrating a structure of a prior art light/ozone asher disclosed in "Semicon News p.47 No.12 ('88)".

In the figures, a light/ozone asher 201 includes a process chamber 220 in which resist and organic substances are removed. The process chamber 220 is a 200 to 250 mm square in plan view and 10 to 15 mm in height. A bottom 221a and a side wall 221b of the process chamber 220 are made of metal, such as aluminum, and an upper wall 222 of the chamber 220 is made of quartz which transmits UV rays. One end of an ozone introducing pipe 223 is open in the center of the upper wall 222.

In addition, UV lamps 202a and 202b and UV lamps 202c and 202d are disposed on the upper wall 222 of the process chamber 220 so as to be positioned on both sides of the ozone introducing pipe 223. A cross section of each of the UV lamps 202a to 202d is an oval configuration which is long sideways, from which UV rays are emitted in the vertical direction and hardly emitted in the horizontal direction. In addition, the UV lamp is approximately 200 mm in length, approximately 40 mm in width, and approximately 15 mm in thickness. The consumed power of each lamp is 140 W.

A sample stage 225 on which a sample 1 is put is disposed in the center of the process chamber 220, and the distance between the sample 1 on the sample stage 225 and each of the UV lamps 202a to 202d is 1 to 2 cm.

In addition, one end of a gas exhaust pipe 224 is open at an lower part of the center of the side wall 221b, which is perpendicular to the longitudinal side of the UV lamps 202a to 202d. In addition, the sample 1 comprises a substrate 10 and a resist film 11 formed on the substrate 10 and having an opening 11a.

Operation of the conventional light ozone asher will be described.

The sample 1 is put on the stage 225 in the process chamber 220, ozone ($O_3$) is introduced into the process chamber 220 from the ozone introducing pipe 223, and the UV lamps 202a and 202d are lighted. Then, ozone ($O_3$) introduced into the process chamber 220 through the ozone introducing pipe 223 absorbs UV rays having a wavelength of 254 nm from the UV lamps and separates to oxygen ($O_2$) and active oxygen (O'). At this time, the resist film 11 absorbs UV rays having wavelengths of 254 nm and 185 nm from the UV lamps and changes in quality, whereby it is likely to react with active oxygen.

Then, the generated active oxygen is diffused to the sample 1 and reacts with the resist 11 and the organic substance ($C_nH_m$) on the sample, whereby the organic substance, such as the resist film, is decomposed into carbon monoxide (CO), carbon dioxide ($CO_2$) and water vapor ($H_2O$) and removed. Then, the carbon monoxide, carbon dioxide, water vapor, oxygen, and ozone ($O_3$) which was not decomposed are exhausted from the process chamber through the gas exhaust pipe 224.

Thus, since the light/ozone asher removes the resist film without using charged particles, damage to a base of the resist film is small when the resist film is removed as compared with a plasma asher.

However, although the damage to the base of the resist film is small when the organic substance, such as resist, is removed by the prior art light ozone asher, the light/ozone asher can not be used in a process of removing a scum, that is, an organic substance left where a resist is removed from the patterned resist film, in the manufacturing process of the semiconductor device because the sample surface is irradiated with UV rays.

Hereinafter, necessity of removing the scum in the manufacturing process of the semiconductor device and specific problems generated in the removal of the scum by the light/ozone asher will be described in detail.

There are process steps of patterning a semiconductor layer, an insulating layer, a metal layer, and the like by selective etching or lift-off in the manufacturing of a semiconductor device and, in the patterning steps, resist films having predetermined patterns are used as masks.

As shown in FIGS. 16(a)–16(e), a process of patterning an insulating film, a semiconductor film, or the like by selective wet-etching comprises forming a resist film 11 by applying, for example, a positive resist after a film 12 to be patterned is formed on the substrate (FIG. 16(a)), exposing the resist film 11 (FIG. 16(b)), removing a exposed part 11b of the resist film by development to form a resist opening 11a (FIG. 16(c)), selectively wet-etching the film 12 using the resist film 11 as a mask (FIG. 16(d)) and finally, removing the resist film 11 to complete the patterning of the film 12 (FIG. 16(e)).

However, when the resist film is developed, if the organic substance (development scum) 11c is left at the resist opening 11a, that is, at the part from which the resist is removed, the side surface of the opening of the film to be processed becomes uneven as shown in FIG. 16(d) or that film is not etched away in some cases. Meanwhile, the above-described defect in patterning is not generated in the case of dry etching even if there is left the development scum. However, if the pattern of the film formed by dry etching becomes fine, the same defect is generated as in wet etching.

In addition, as shown in FIGS. 17(a)–17(e), a process of patterning a metal film, such as an electrode material, by lift-off comprises forming a resist film 11 by applying, for example, a positive resist on the substrate 10 (FIG. 17(a)), exposing the resist film 11 (FIG. 17(b)), removing an exposed part 11b of the resist film by development to form a resist opening 11a (FIG. 17(c)), depositing a film material 13 on the whole surface by vapor deposition or the like (FIG. 17(d)) and lifting off the film material 13 through dissolution of the resist film 11 to form a film 13a having a predetermined pattern (FIG. 17(e)).

In case of the patterning by lift-off, when the resist film is developed, if the organic substance (development scum) 11c is left at the resist opening 11a, that is, at the part from which the resist is removed, the width of the film 13a patterned as shown in FIG. 17(e) varies according to position, or the film material is all removed in some cases.

Therefore, in the patterning process of the resist film, the above-described defect in the film caused by development scum has been conventionally prevented by removing the development scum in a plasma asher after the resist film is developed. In this case, however, the base layer of the resist film is considerably damaged by the plasma.

Thus, it is thought that the scum can be removed by a light ozone asher capable of removing an organic substance while preventing the damage to the base layer. However, when the light/ozone asher is used in removing the scum, a bad effect occurs in the resist film as follows because of UV rays.

That is, when the scum is removed by the light/ozone asher, the resist 11 changes in quality because of UV rays. For example, the positive resist becomes difficult to dissolve in a solvent such as acetone. More specifically, in the lift-off process, a solvent such as acetone permeates the resist film 11 from a corner A of the resist film 11 in which the film material 13 is thin as shown in FIG. 18(b), and the resist film is dissolved. At this time, however, if the resist film has changed in quality, the resist film is not dissolved by the solvent and it becomes difficult to lift off the film material.

In addition, since the sample 1 is heated by absorbing UV rays, the pattern configuration of the resist film 11 is destroyed as shown in FIG. 18(a), and it becomes very difficult to control the reduction of a resist film thickness below several nm even if the process is performed for a short time. Consequently, patterning precision of the film is considerably degraded.

SUMMARY OF THE INVENTION

An object of the present invention is to provide a light ozone asher capable of removing an organic substance (development scum) left where a resist is removed from a resist pattern without changing the pattern configuration or the thickness of the resist.

Another object of the present invention is to provide a light ashing method capable of removing the development scum without changing the pattern configuration or the thickness of the resist using the conventional light/ozone asher.

A further object of the present invention is to provide a method of manufacturing a semiconductor device capable of removing a development scum without changing a pattern configuration or a thickness of a resist, whereby a film can be patterned by photolithography with high precision.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a light ozone asher comprises a process chamber in which a sample stage is disposed and a surface of a sample put on the stage is processed by active oxygen generated by irradiating ozone with UV rays, and means for applying UV rays to the process chamber in such as manner that the surface of the sample put on the sample stage is not irradiated with the UV rays. Since the sample surface in the process chamber is not irradiated with the UV rays when an organic substance on the sample surface is removed by active oxygen generated by irradiating ozone with the UV rays in the process chamber, the organic substance (scum) left by removal of parts of an organic substance from a patterned organic substance film can be removed without destroying the pattern of the organic substance film.

According to a second aspect of the present invention, in the light/ozone asher, a pipe for introducing ozone into the process chamber is attached to a predetermined part of a wall of the process chamber so that ozone introduced into the process chamber passes through a region irradiated with UV rays and reaches the region which is not irradiated with UV rays. Therefore, ozone can be effectively decomposed into active oxygen by UV rays.

According to a third aspect of the present invention, in the light ozone asher, the means for applying UV rays comprises UV lamps disposed on both sides of a region just above the sample stage. Therefore, the means can be easily implemented only by removing the UV lamps positioned just above the sample stage in the conventional light/ozone asher.

According to a fourth aspect of the present invention, in the light/ozone asher, the means for applying UV rays comprises a plurality of UV lamps disposed above the sample stage and shielding plates positioned between the UV lamps and the sample stage, for preventing UV rays from reaching the sample on the stage. Therefore, the means can be easily implemented only by adding the shielding plates to the conventional light/ozone asher.

According to a fifth aspect of the present invention, in the light/ozone asher, the shielding plates comprise first and second shielding plates vertically disposed at a predetermined interval, in which the first shielding plate has a plurality of holes formed over the entire surface and the second shielding plate has a plurality of holes formed over the entire surface so as not to overlap with the holes in the first shielding plate. Since active oxygen decomposed from ozone reaches the sample surface through the holes of the first and second shielding plates, active oxygen can be effectively introduced onto the sample surface.

According to a sixth aspect of the present invention, in the light/ozone asher, the process chamber comprises a part in which active oxygen is generated by irradiating ozone with UV rays and a part in which the sample surface is processed by the active oxygen, between which there is provided a partition plate made of a material which does not transmit UV rays. Since the active oxygen is uniformly introduced into the process chamber, a large wafer can be uniformly processed over the entire surface of the wafer and the degree of freedom in positioning the ozone introducing pipe can be improved.

According to a seventh aspect of the present invention, in the light/ozone asher, the process chamber comprises a part in which active oxygen is generated by irradiating ozone with UV rays and a part in which the sample surface is processed by the active oxygen. Further, among the UV lamps disposed at the active oxygen generating part, the UV lamp disposed above the sample stage has a shielding film at its lower side. Therefore, a region which is not irradiated with UV rays can be easily formed.

According to an eighth aspect of the present invention, in the light/ozone asher, the means for applying UV rays comprises UV lamps disposed on both sides of the sample stage so that upper end faces of the lamps are positioned lower than the sample surface on the stage. Therefore, heating by the UV lamps of the sample can be reduced.

According to a ninth aspect of the present invention, in the light/ozone asher, the means for applying UV rays comprises a plurality of UV lamps disposed on the lower side of the sample stage, which is opposite to the side on which the sample is put. Therefore, heating by the UV lamps of the sample can be relatively reduced.

According to a tenth aspect of the present invention, in the light/ozone asher, the sample stage is movable between a region which is irradiated with UV rays by the means for applying UV rays and a region which is not irradiated with UV rays. In the process chamber, there are implemented a first process of irradiating the sample on the stage with UV rays with the UV lamps lighted at low power while ozone is not supplied to the process chamber with the sample on the stage positioned at the region irradiated with UV rays, and a second process of processing the sample with active oxygen with the UV lamps lighted at high power while ozone is supplied to the process chamber in a state where the sample on the stage positioned at the region which is not irradiated with UV rays. Therefore, a development scum of the resist can be removed without destroying the resist pattern, and UV cure and scum removal can be continuously implemented in the same apparatus.

According to an eleventh aspect of the present invention, in the light/ozone asher, the means for applying UV rays comprises UV lamps disposed in the vicinity of opposing side walls of the process chamber at a position of predetermined height, only a region between the UV lamps and an upper region thereof are not irradiated with UV rays and a lower region of the UV lamps is irradiated with UV rays when the UV lamps are lighted, and an ozone introducing pipe for introducing ozone into the process chamber is attached to a side wall of the process chamber at a position higher than the UV lamps so that ozone passes through the region irradiated with UV rays just above the UV lamps and reaches to the sample stage positioned at the region which is not irradiated with UV rays. Since the UV lamps are disposed in the region between the ozone introducing pipe and the sample stage, active oxygen decomposed from ozone can be effectively introduced onto the sample surface.

According to a twelfth aspect of the present invention, in the light ozone asher, the shielding plates are movable between a first region between the UV lamps and the sample stage and a second region positioned beside the first region. In the process chamber, there are implemented a first process of irradiating the sample on the sample stage with UV rays from the UV lamps lighted at low power while ozone is not supplied to the process chamber in a state where the shielding plates are positioned at the second region, and a second process of processing the sample on the sample stage with active oxygen with the UV lamps lighted at high power while ozone is supplied to the process chamber in a state where the shielding plates are positioned at the first region. Therefore, a development scum of a resist can be removed without destroying the resist pattern, and UV cure and scum removal can be continuously implemented in the same apparatus.

According to a thirteenth aspect of the present invention, in the light/ozone asher, the sample stage includes an internal mechanism for cooling the stage body. Therefore, the sample can be rapidly cooled down.

According to a fourteenth aspect of the present invention, in the light/ozone asher, the means for applying UV rays comprises a plurality of UV lamps disposed above the sample stage, and a control circuit for separately lighting the UV lamps positioned just above the stage and the UV lamps on both sides thereof. Therefore, the means can be easily implemented only by adding the control circuit to the conventional light/ozone asher.

According to a fifteenth aspect of the present invention, a light ashing method comprises holding a sample in a holder which does not transmit UV rays but allows gas to permeate, producing active oxygen by irradiating ozone introduced into the process chamber with UV rays, and removing an organic substance on the sample in the holder with the active oxygen. Therefore, a development scum left after a resist film or the like comprising an organic substance is processed can be removed without destroying the pattern of the resist film.

According to a sixteenth aspect of the present invention, a method of manufacturing a semiconductor device comprises selectively processing a surface of a sample, and removing an organic substance on a region of the sample surface with active oxygen generated by irradiating ozone with UV rays, in which the sample surface is not irradiated with UV rays when the organic substance is removed. Therefore, a development scum can be removed without damaging the sample surface nor destroying a pattern of the patterned organic film, whereby patterning of the film can be performed by photolithography with high precision in semiconductor device.

BRIEF DESCRIPTION OF DRAWINGS

FIGS. 1(a)–1(b) are schematic views for describing a light ozone asher according to a first embodiment of the present invention, in which FIG. 1(a) is a side view thereof and FIG. 1(b) is a partially broken plan view thereof.

FIGS. 2(a)–2(b) are schematic views for describing a light ozone asher according to a second embodiment of the present invention, in which FIG. 2(a) is a side view thereof and FIG. 2(b) is a partially broken plan view thereof.

FIGS. 3(a)–3(b) are schematic views showing a structure of UV ray shielding plates disposed in a process chamber of the light ozone asher according to the second embodiment of the present invention, in which FIG. 3(a) is a plan view thereof and FIG. 3(b) is a sectional view thereof.

FIGS. 4(a)–4(b) are views for describing a light ozone asher according to a third embodiment of the present invention, in which FIG. 4(a) is a sectional view thereof and FIG. 4(b) is a partially broken plan view thereof.

FIGS. 5(a)–5(b) are views for describing a light ozone asher according to a fourth embodiment of the present invention, in which FIG. 5(a) is a sectional view thereof and FIG. 5(b) is a partially broken plan view thereof.

FIGS. 6(a)–6(b) are views for describing a light ozone asher according to a fifth embodiment of the present invention, in which FIG. 6(a) is a side view thereof and FIG. 6(b) is a partially broken plan view thereof.

FIGS. 7(a)–7(b) are views for describing a light ozone asher according to a sixth embodiment of the present invention, in which FIG. 7(a) is a side view thereof and FIG. 7(b) is a partially broken plan view thereof.

FIGS. 8(a)–8(f) are schematic views for describing a wafer holder used in a light ashing method according to a seventh embodiment of the present invention, in which FIG. 8(a) is a front view thereof, FIG. 8(b) is a sectional view taken along a line 8b—8b of FIG. 8(a), FIG. 8(c) is a sectional view of FIG. 8(a), FIGS. 8(d) and 8(e) are front view and plan view, respectively showing a state in which a wafer is held in the wafer holder, and FIG. 8(f) is a sectional view taken along a line 8f—8f of FIG. 8(e).

FIGS. 9(a)–9(c) are schematic views showing a light ozone asher according to an eighth embodiment of the present invention, in which a sample stage is movable and UV cure and removal of a development scum can be continuously implemented, in which FIG. 9(a) is a side view showing a state in a process chamber at the time of UV cure, FIG. 9(b) is a side view showing a state in the process chamber at the time of removal of the development scum, and FIG. 9(c) is a partially broken plan view of the light ozone asher.

FIGS. 10(a)–10(c) are schematic views showing a light ozone asher according to a ninth embodiment of the present invention, in which UV ray shielding plates are movable and UV cure and removal of a development scum can be continuously implemented, in which FIG. 10(a) is a side view showing a state in a process chamber at the time of UV cure, FIG. 10(b) is a side view showing a state in the process chamber at the time of removal of the development scum and FIG. 9(c) is a sectional view showing the structure of the shielding plates.

FIGS. 11(a)–11(b) are views for describing a light ozone asher according to a tenth embodiment of the present invention, in which FIG. 11(a) is a schematic view showing the whole structure thereof and FIG. 11(b) is a view showing the structure of a sample stage thereof.

FIGS. 12(a)–12(b) are views for describing a light ozone asher according to an eleventh embodiment of the present invention, in which FIG. 12(a) is a sectional view showing the structure of the light ozone asher and FIG. 12(b) is the view showing a structure of a sample stage thereof.

FIGS. 13(a)–13(f) are views for describing a process of forming electrodes in manufacturing a semiconductor device according to a twelfth embodiment of the present invention, in which FIG. 13(a) shows a step of applying a resist, FIG. 13(b) shows a step of exposure, FIG. 13(c) shows a step of development, FIG. 13(d) shows a step of removing a scum, FIG. 13(e) shows a step of depositing a metal film, and FIG. 13(f) shows a step of lifting off the metal film.

FIGS. 14(a)–14(b) are views describing a structure of a light ozone asher used in the semiconductor manufacturing method, in which FIG. 14(a) is a front view thereof and FIG. 14(b) is a plan view thereof.

FIGS. 15(a)–15(b) are views for describing a conventional light ozone asher, in which FIG. 15(a) is a front view thereof and FIG. 15(b) is a plan view thereof.

FIGS. 16(a)–16(e) are views for describing problems in a method of selective etching using a resist film as a mask, in which FIG. 16(a) shows a step of applying a resist, FIG. 16(b) shows a step of exposure, FIG. 16(c) shows a step of development, FIG. 16(d) shows a step of etching a film to be processed and FIG. 16(e) shows a step of removing the resist film.

FIGS. 17(a)–17(e) are views for describing problems in a method of depositing and lifting off a metal film or the like using a resist film as a mask, in which FIG. 17(a) shows a step of applying a resist, FIG. 17(b) shows a step of exposure, FIG. 17(c) shows a step of development, FIG. 17(d) shows a step of depositing the metal film, and FIG. 17(e) shows a step of lifting off the metal film.

FIGS. 18(a)–18(b) are views for describing the influence of UV rays on a resist film, in which FIG. 18(a) is a view showing a state where a configuration of the resist film is destroyed by irradiation with UV rays and FIG. 18(b) is a view for describing problems in a case where the resist film changes in quality through irradiation with UV rays.

FIGS. 19(a)–19(c) are views showing a method of forming a resist pattern with a positive resist, in which FIG. 19(a) shows a process flow thereof, FIG. 19 (b) is a sectional view showing an exposing step, and FIG. 19(c) is a sectional view showing a developing step.

FIGS. 20(a)–20(d) are views showing a method of forming a resist film having a negative pattern using a positive resist, in which FIG. 20(a) shows a process flow, FIG. 20(b) is a sectional view showing an exposing step, and FIG. 20(c) is a sectional view showing a developing step.

DESCRIPTION OF THE PREFERRED EMBODIMENTS

Embodiment 1

Figure 1:
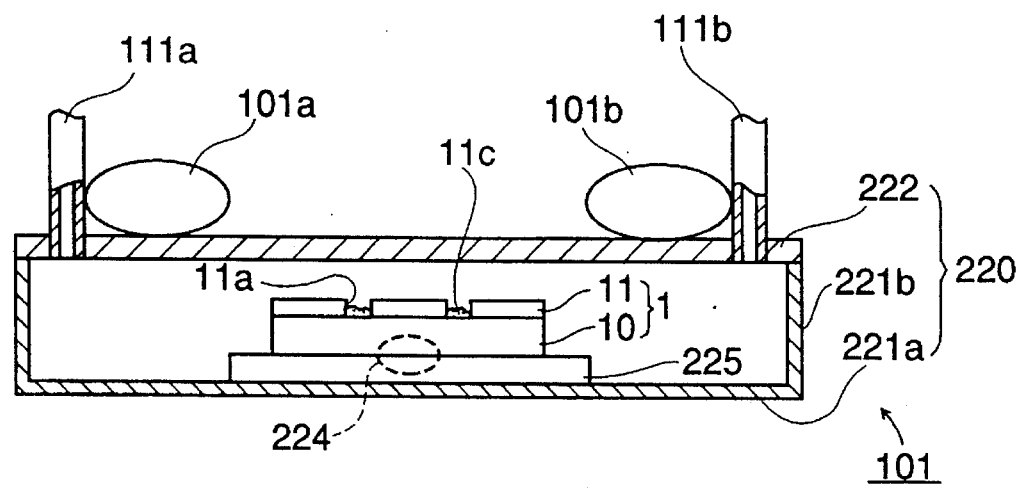
Figure 1:
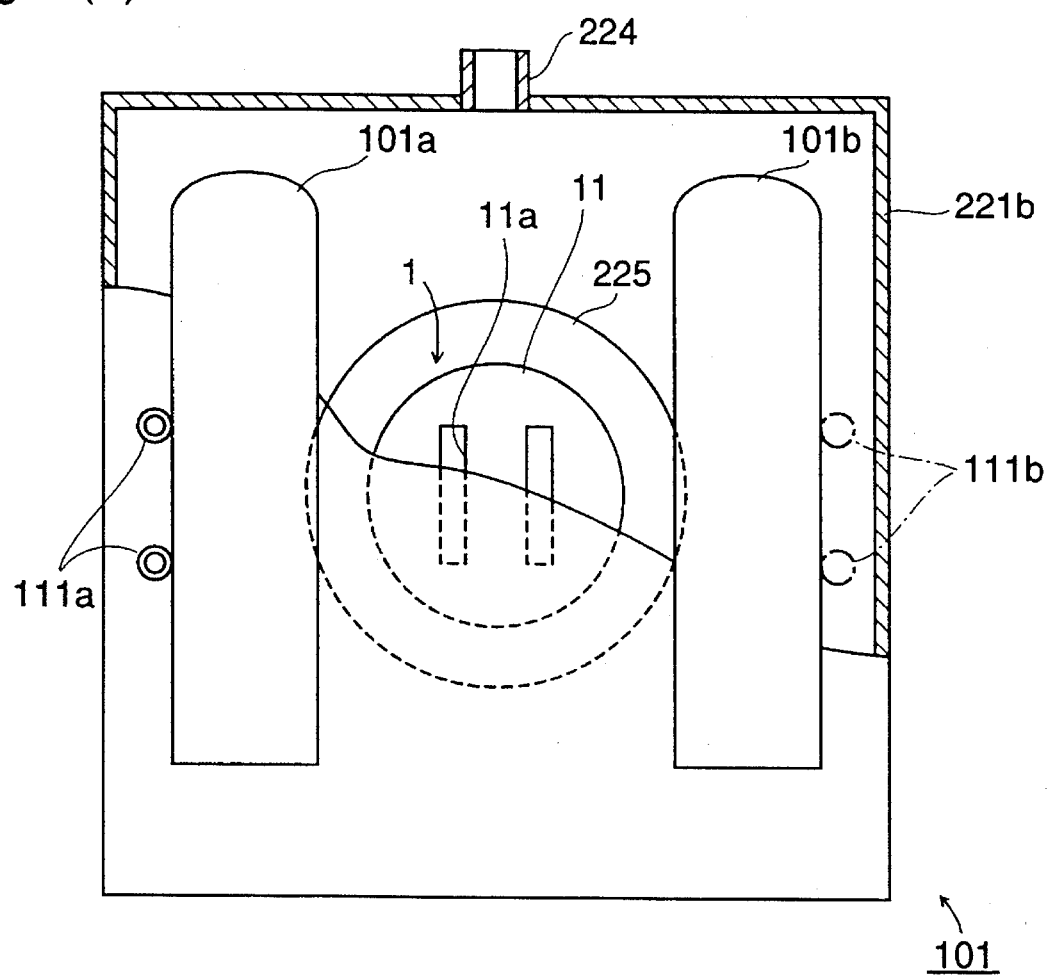

FIGS. 1(a)–1(b) are schematic views for describing a light ozone asher according to a first embodiment of the present invention, in which FIG. 1(a) is a sectional view thereof and FIG. 1(b) is a plan view thereof.

Referring to FIGS. 1(a)–1(b), a light ozone asher 101 comprises UV lamps 101a and 101b disposed on both sides of a region just above a sample stage 225. The UV lamps are of the same structure as UV lamps 202a to 202d in a conventional light ozone asher and emit UV rays in the vertical direction. Therefore, a surface of a sample put on the sample stage 225 in a region which is not irradiated with UV rays in the light ozone asher 101 when the UV lamps emit UV rays. In addition, the stage 225 is kept at approximately 60° C. when a resist film is removed.

In addition, according to the embodiment of the present invention, ozone introducing pipes 111a and 111b are attached to an edge of the upper face of a process chamber 220 so that ozone introduced therefrom reaches the sample stage through the lower side of the UV lamps 101a and 101b.

In addition, a substrate 10 is a GaAs wafer which is 3 inches in diameter, and a development scum 11c existing at a part where the resist is removed in the patterned resist 11 is less than 2 nm in thickness. The structure other than the above is the same as that of the conventional light ozone asher.

Next, an operation will be described.

The sample 1 provided through processes of exposure and development of the resist is put on the stage 225 in the process chamber 220, and ozone ($O_3$) is introduced from the ozone introducing pipes 111a and 111b into the process chamber 220. Then, when the UV lamps 101a and 101b are lighted, the ozone in the process chamber 220 absorbs light having a wavelength of 254 nm from the UV lamps 101a and 101b and separates into oxygen ($O_2$) and active oxygen (O'). In addition, according to this embodiment of the present invention, since the UV lamps are not disposed just above the sample stage 225, the surface of the sample 1 in a region which is not irradiated with UV rays at the time of irradiation of UV rays.

The active oxygen is diffused onto the sample 1 and reacts with the development scum 11c on the sample 1, whereby the development scum 11c is decomposed into carbon monoxide (CO), carbon dioxide ($CO_2$) and water vapor ($H_2O$) and removed. In addition, carbon monoxide, carbon dioxide and water vapor which were generated by decomposition of the resist, oxygen, and ozone which was not decomposed are discharged from the process chamber 220 through an exhaust pipe 224.

Thus, according to the above embodiment of the present invention, since the UV lamps 101a and 101b are disposed only adjacent and outside the region directly opposite the sample stage 225, so that the surface of the sample 1 put on the sample stage 225 is not irradiated with UV rays at the time of irradiation of UV rays. Therefore, the scum on the surface of the sample is removed by active oxygen which is generated while the ozone introduced into the process chamber is decomposed through the irradiation by UV rays. Thus, since the resist film on the sample is not irradiated with UV rays, the resist does not change in quality. In addition, since the temperature of the sample 1 does not rise because the sample 1 does not absorb UV rays, the resist pattern is not destroyed.

In addition, since the temperature of the sample 1 does not rise, the scum can be removed at a low temperature, whereby the reduction in thickness of the resist film 11 can be controlled to be less than several nm at the time of removal of the development scum 11c.

Embodiment 2

Figure 2:
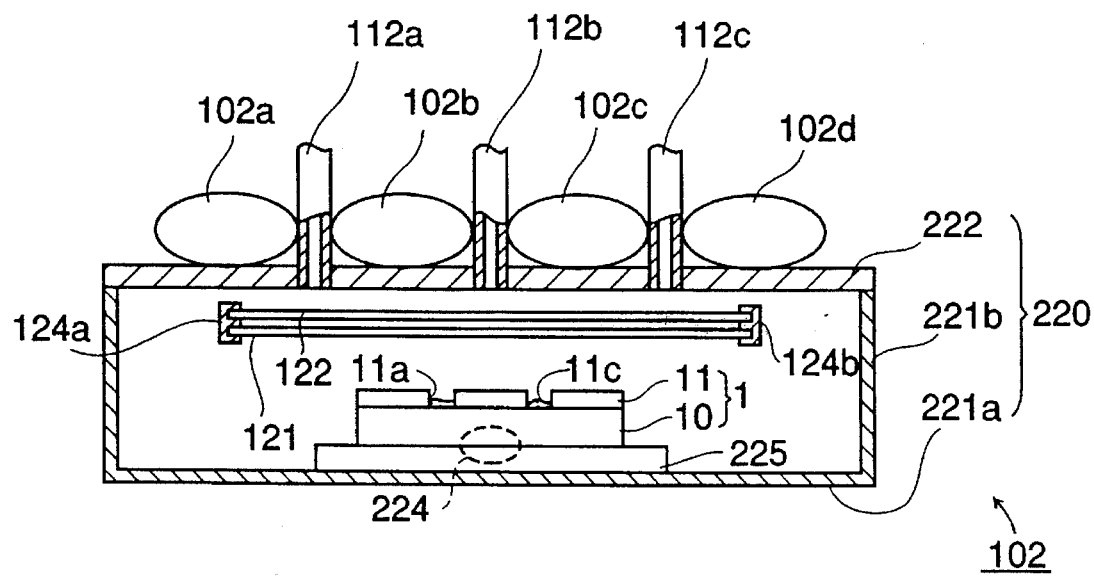
Figure 2:
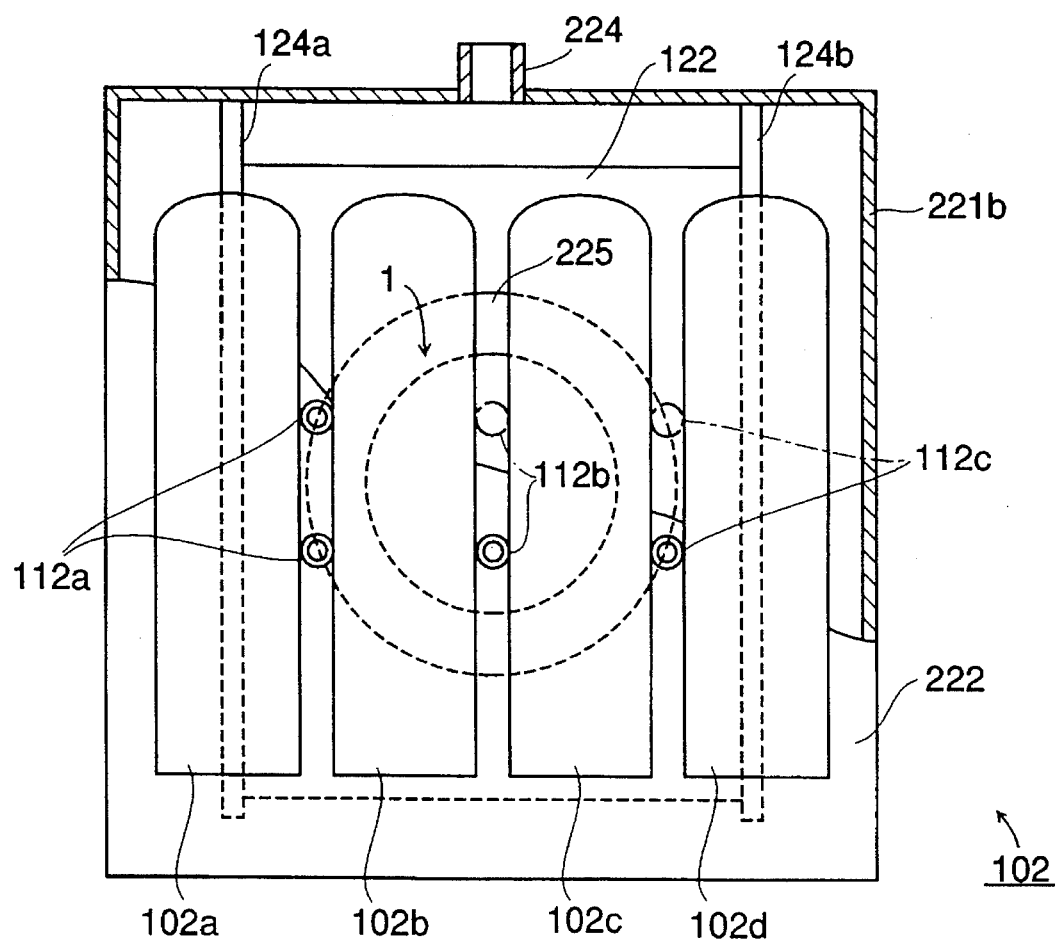
Figure 3:
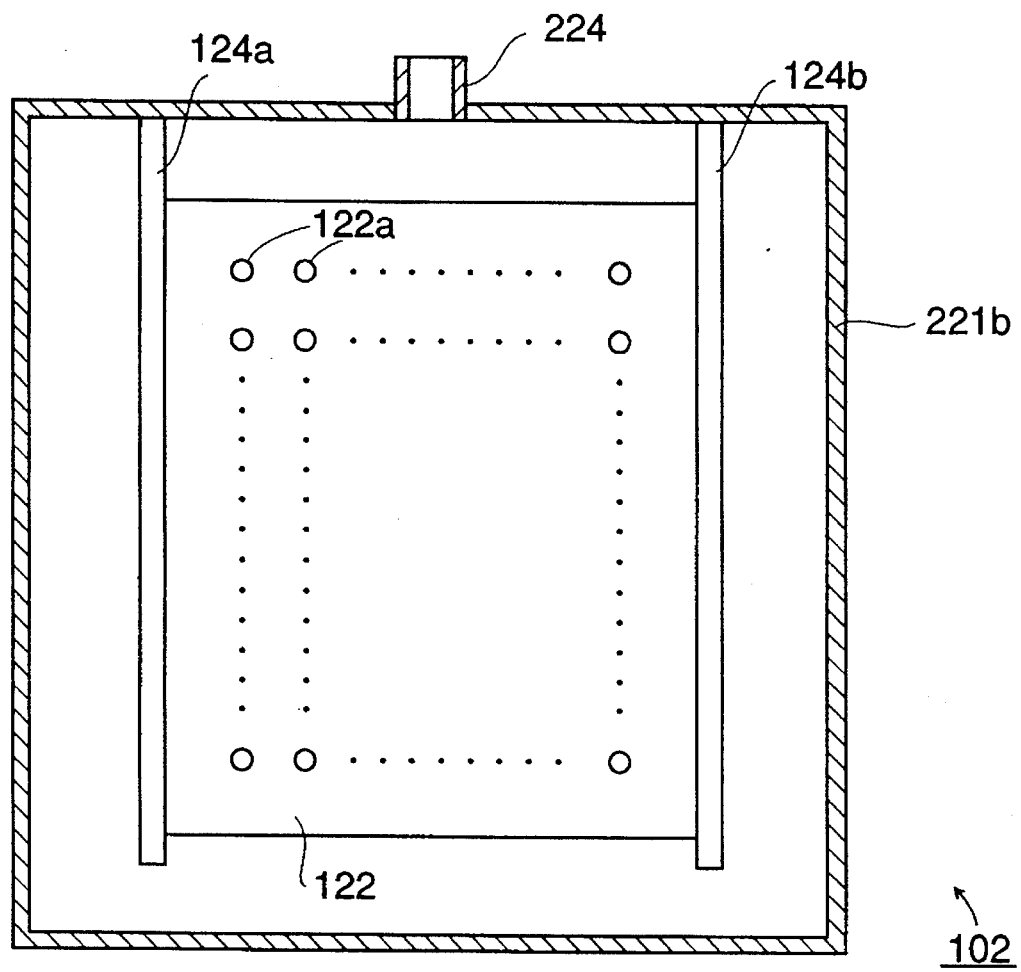
Figure 3:
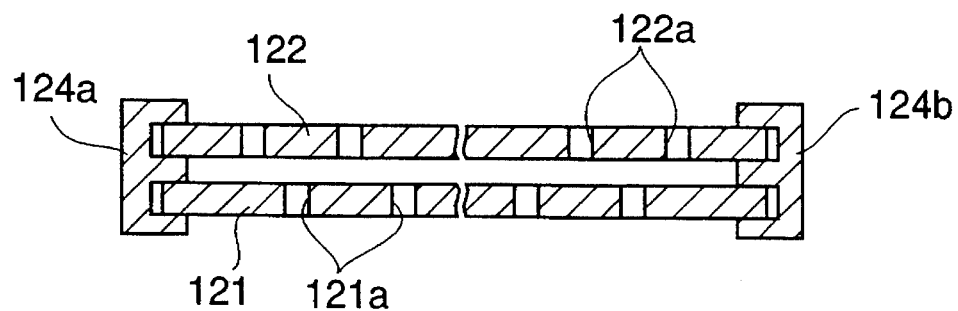

FIGS. 2(a)–2(b) are views for describing a light ozone asher according to a second embodiment of the present invention, in which FIG. 2(a) is a sectional view thereof and FIG. 2(b) is a plan view thereof. FIGS. 3(a) and 3(b) show the structure of shielding plates provided in a process chamber of the light ozone asher.

Referring to FIGS. 2(a)–2(b), a light ozone asher 102 comprises a process chamber 220 in which an organic substance, such as a resist, is removed by active oxygen generated through decomposition of ozone by UV rays. According to this embodiment of the present invention, first and second shielding plates (Pyrex plates) 121 and 122 having the same outer dimension are provided between an upper wall 222 of the process chamber 220 and the sample stage 225 so as to shield the surface of the sample on the stage 225 from UV rays. The shielding plates 121 and 122 have a plurality of holes 121a and 122a for allowing the passage of gas, respectively, and that do not overlap with each other.

In addition, according to this embodiment of the present invention, like the conventional light ozone asher, the UV lamps 102a to 102d are provided over the upper part of the process chamber, and ozone introducing pipes 112a, 112b and 112c are disposed between the adjacent UV lamps. The structure other than the above is the same as that of the conventional ozone asher.

Then, function and effect will be described.

As in the first embodiment of the present invention, when a sample from which a scum is to be removed is disposed in the process chamber, ozone is introduced into the chamber and the UV lamps are lighted, active oxygen generated when ozone absorbs UV rays is diffused onto the sample 1 through the holes 122a and 121a of the second and first shielding plates 122 and 121, respectively, to remove the development scum 2 on the surface of the sample. At this time, since UV rays from the UV lamps are absorbed by the shielding plates 122 and 121, they do not reach the sample 1.

Therefore, while the development scum of the resist is removed, the resist film 11 does not change in quality and its pattern configuration is not destroyed. In addition, the reduction in thickness of the resist when the development scum is removed can be controlled to be under several nm.

Although the ozone introducing pipes are provided between the adjacent UV lamps according to the second embodiment of the present invention, they may be disposed at an edge of the process chamber outside the UV lamps as in the first embodiment of the present invention.

Embodiment 3

Figure 4:
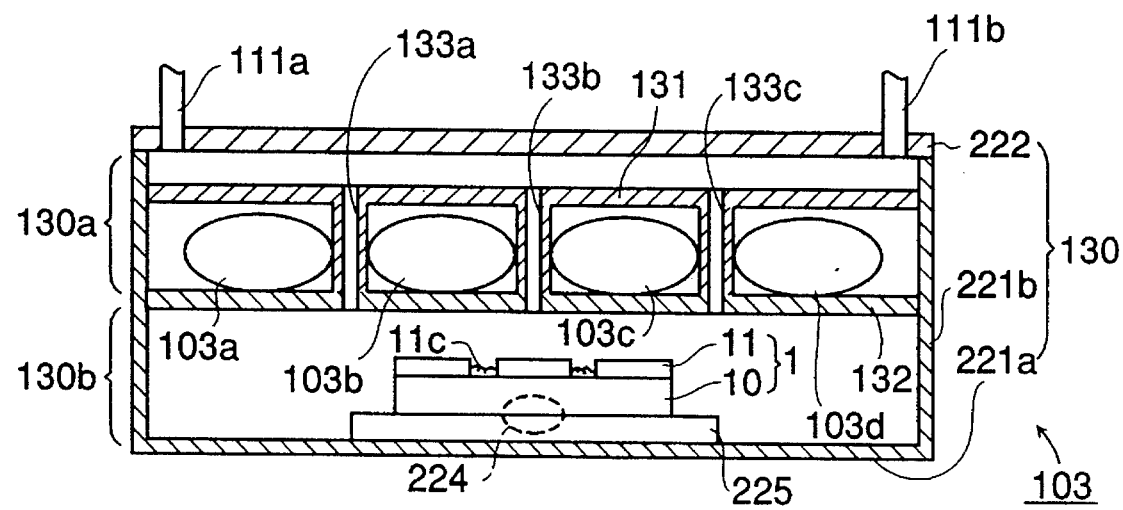
Figure 4:
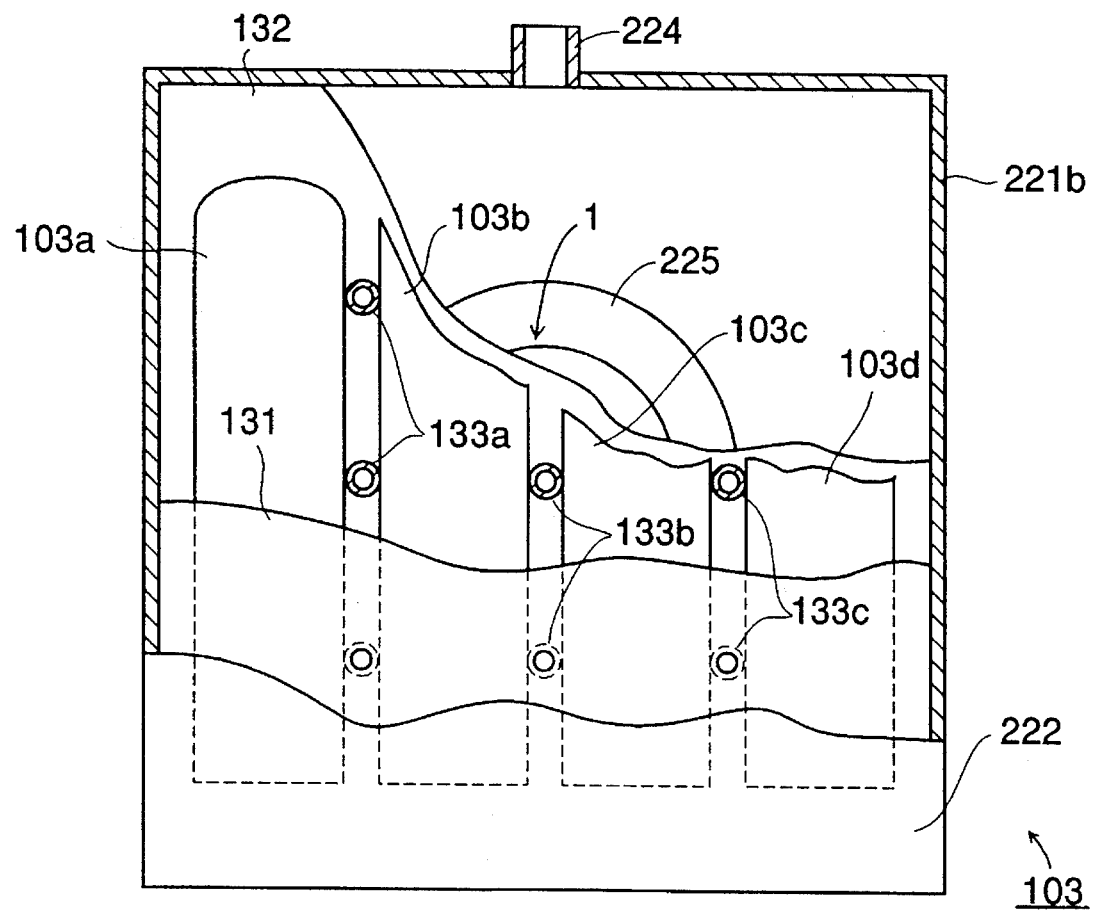

FIGS. 4(a)–4(b) are views for describing a light ozone asher according to a third embodiment of the present invention, in which FIG. 4(a) is a sectional view thereof and FIG. 4(b) is a partially broken plan view thereof.

Referring to FIGS. 4(a)–4(b), the same reference numerals as in FIGS. 1(a)–1(b) designate the same or corresponding parts. A light ozone asher 103 of this third embodiment comprises a process chamber 130 having an active oxygen generating part 130a in which active oxygen is generated by irradiating ozone with UV rays, and a sample processing part 130b in which the surface of the sample is processed by active oxygen from the active oxygen generating part 130a.

More specifically, the process chamber 130 is partitioned into three spaces, that is, upper, middle, and lower parts by first and second partition plates 131 and 132 which are disposed parallel to the bottom of the process chamber 130. The upper and middle spaces are the active oxygen generating part 130a and the lower space is the sample processing part 130b. The sample stage 225 is disposed in the sample processing part 130b. In this case, the first partition plate 131 is made of quartz which transmits UV rays and the second partition plate 132 is made of Pyrex or the like which absorbs UV rays.

In addition, in the middle space between the first and second partition plates 131, as in the second embodiment of the present invention, there are disposed four UV lamps 103a to 103d opposite the process chamber. Gas passing pipes 133a, 133b, and 133c which connect the upper space, that is, the active oxygen generating part 130a to the lower space, that is, the sample processing part 130b, are provided between the adjacent UV lamps.

Next, function and effect will be described.

When ozone is introduced and the UV lamps 103a to 103d are lighted after the sample 1 from which the scum is to be removed is disposed in the sample processing part 130b, ozone introduced into the active oxygen generating part 130a absorbs UV rays and separates into oxygen and active oxygen. The generated active oxygen passes through the pipes 133a to 133c and flows into the sample processing part 130b. Then, it is diffused to the sample 1 and reacts with the development scum 11c on the surface of the sample, whereby the development scum 11c is decomposed to carbon monoxide, carbon dioxide, and water vapor and removed.

At this time, since UV rays from the UV lamps are absorbed by the second partition plate 132 serving as a shielding plate, it does not reach the sample surface.

Thus, as in the first and second embodiments of the present invention, when the development scum of the resist is removed, the resist film 11 does not change in quality and its pattern configuration is not destroyed. In addition, the reduction in thickness of the resist while the development scum is removed can be controlled to be under several nm.

In addition, according to this third embodiment of the present invention, since inlets for the active oxygen into the sample processing chamber, that is, the gas introducing pipes 133a to 133c, are disposed at equal intervals above the sample stage 225, it is suitable for processing of a large wafer. Further, since the active oxygen generating part 130a and the sample processing part 130b are partitioned, the ozone introducing pipes 111a and 111b can be disposed at any part of the active oxygen generating part 130, whereby the degree of freedom in positioning of the ozone introducing pipes is improved.

Embodiment 4

Figure 5:
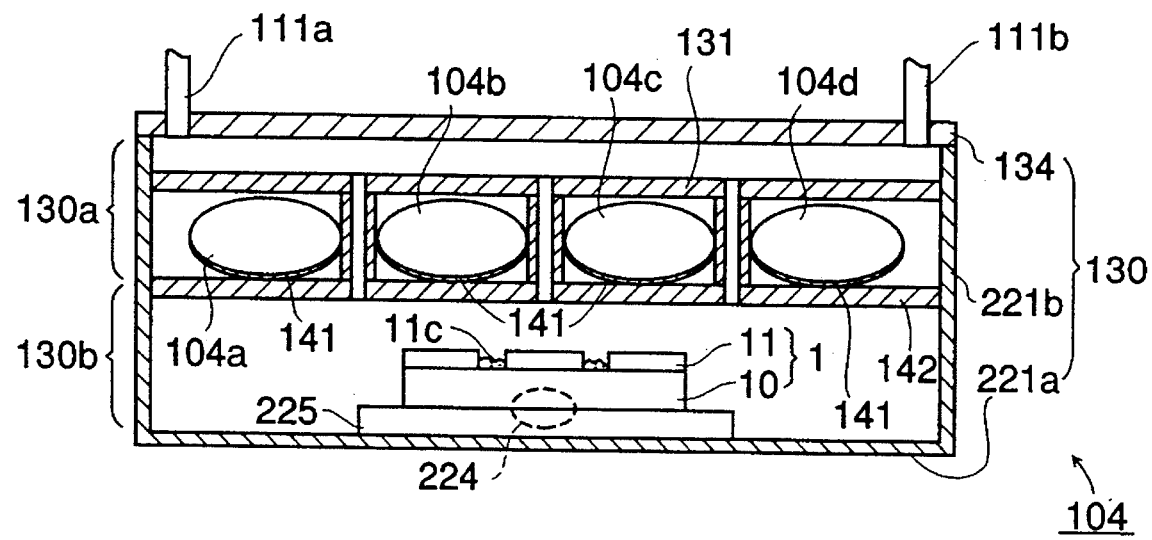
Figure 5:
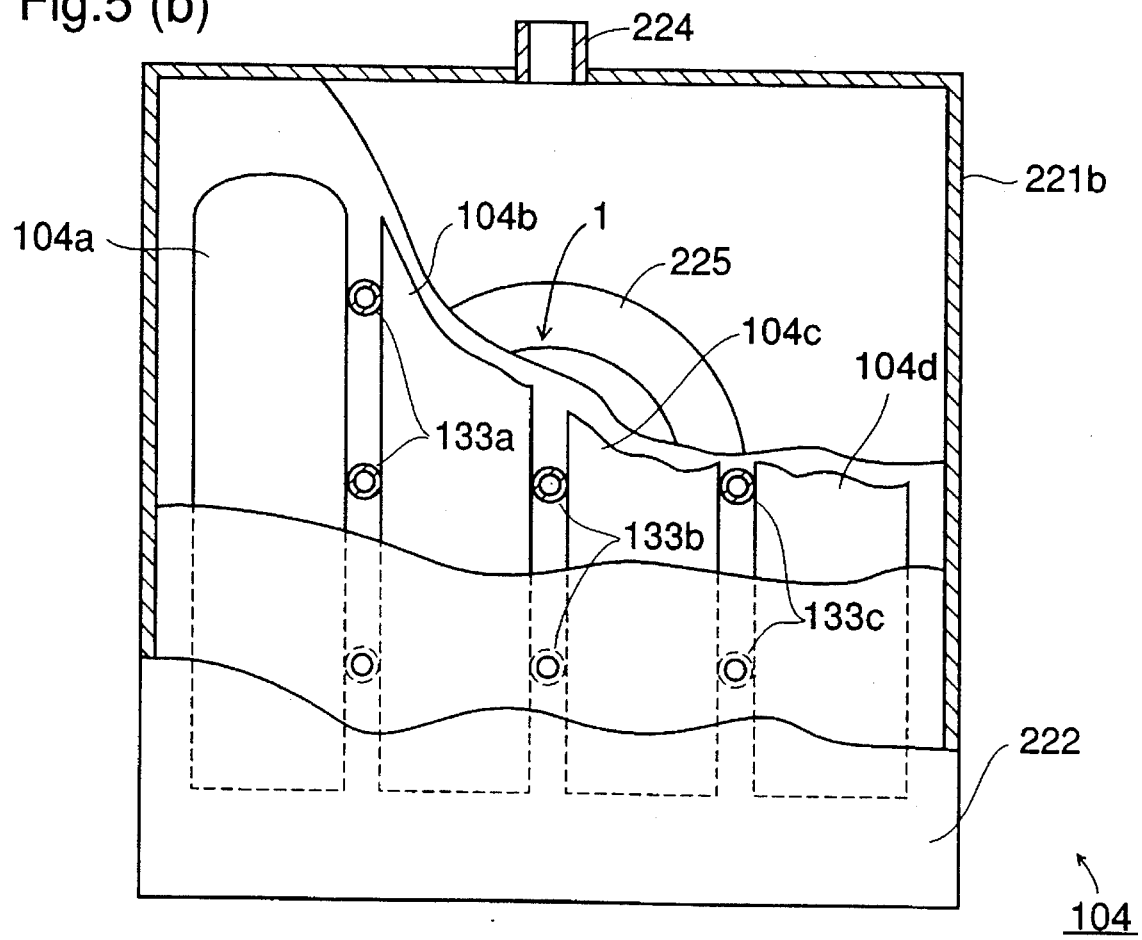

FIGS. 5(a)–5(b) are schematic views for describing a light ozone asher according to a fourth embodiment of the present invention, in which FIG. 5(a) is a sectional view thereof and FIG. 5(b) is a partially broken plane view thereof.

Referring to FIGS. 5(a)–5(b), the light ozone asher 104 according to this fourth embodiment has UV lamps 104a to 104d instead of the UV lamps in the light ozone asher according to the third embodiment of the present invention. A shielding coating which absorbs UV rays, such as an aromatic compound, is applied to a lower surface of each of the UV lamps 104a to 104d.

In addition, the second partition plate 142 is made of quartz like the first partition plate 131.

In the structure of the fourth embodiment of the present invention, the same effect as in the third embodiment can be achieved.

Although the UV lamps are disposed over almost the whole region of the process chamber 130 in the third and fourth embodiments of the present invention, the UV lamps just above the sample stage 225 may be dispensed with. In this case, however, when the wafer is large, removal of the scum in the center of the wafer could be insufficient.

Although the shielding coating which absorbs UV rays is applied to the lower hemisphere of the UV lamp as a shielding film in the fourth embodiment of the present invention, the shielding film may be a reflective film made of a plated Ag layer.

Embodiment 5

Figure 6:
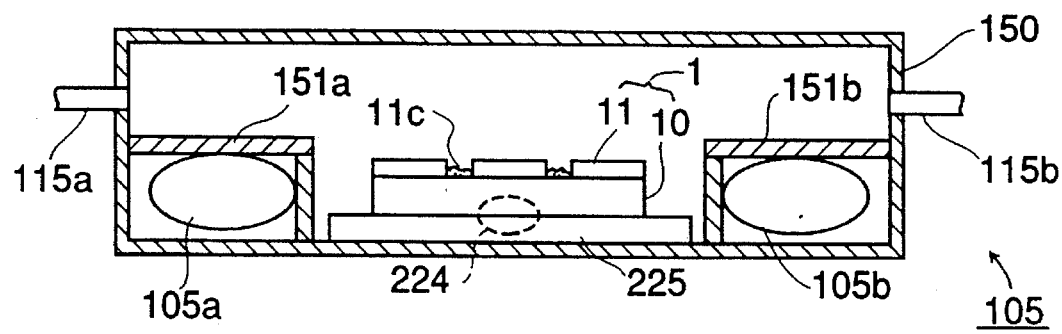
Figure 6:
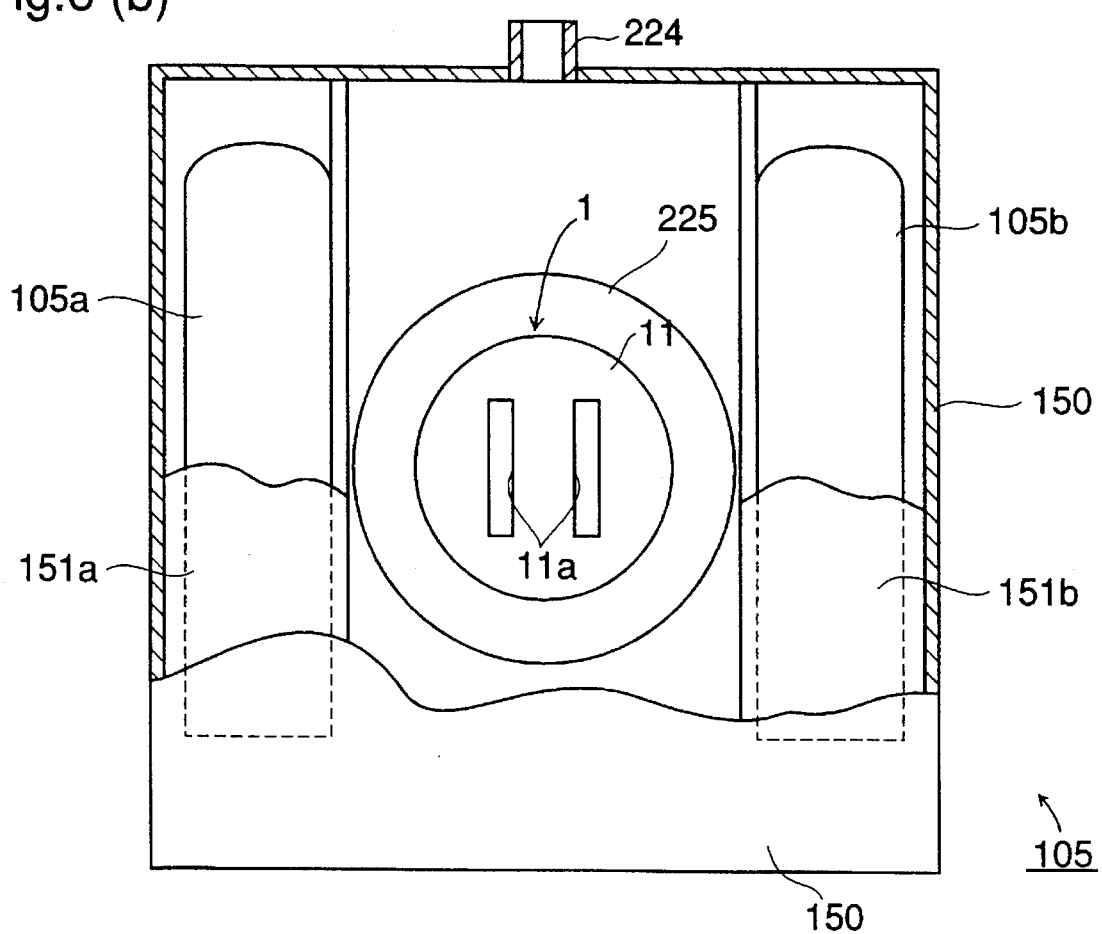

FIGS. 6(a)–6(b) are views for describing a light ozone asher according to a fifth embodiment of the present invention, in which FIG. 6(a) is a sectional view thereof and FIG. 6(b) is a partially broken plan view thereof.

Referring to FIGS. 6(a)–6(b), the light ozone asher 150 according to this fifth embodiment has a process chamber 150 in which an organic substance, such as a resist, is removed, and ozone introducing pipes 115a and 115b which are attached to an upper part of a side wall of the process chamber 150. The sample stage 225 is disposed in the center of the process chamber 150 and UV lamps 105a and 105b housed in lamp containers 151a and 151b, respectively, are disposed on both sides of the stage 225. The UV lamps 105a and 105b are disposed such that the upper surface thereof is lower than the surface of the sample 1 on the stage 225. In addition, the lamp containers 151a and 151b are made of a material which transmits UV rays such as quartz.

Then, function and effect will be described.

When ozone is introduced and the UV lamps 105a and 105b are lighted after the sample 1 from which the scum is to be removed is disposed in the process chamber 150, ozone introduced into the process chamber 150 absorbs UV rays and separates into oxygen and active oxygen. The generated active oxygen is diffused onto the sample 1 and reacts with the development scum 11c on the surface of the sample, whereby the development scum 11c is decomposed to carbon monoxide, carbon dioxide, and water vapor and then, removed.

At this time, since UV rays are emitted from the UV lamps on both sides of the stage 225 upward, the sample surface is not irradiated with UV rays. Therefore, when the development scum is removed, as in the first and second embodiments of the present invention, the resist film 11 is not change in quality and its pattern does not destroyed, whereby the reduction of the thickness of the resist film can be controlled to be under several nm.

In addition, according to this fifth embodiment of the present invention, since the UV lamps are disposed on both sides of the sample stage 225, an the influence of heat from the UV lamps on the sample can be small.

Although the UV lamps are horizontally disposed so as to emit UV rays in the vertical direction in this fifth embodiment, it may be inclined so as to emit UV rays in an oblique direction. In this case, however, the UV lamps have to be inclined in such a manner that a part of the UV lamp which is close to the sample 1 is higher than a part thereof which is far from the sample.

Embodiment 6

Figure 7:
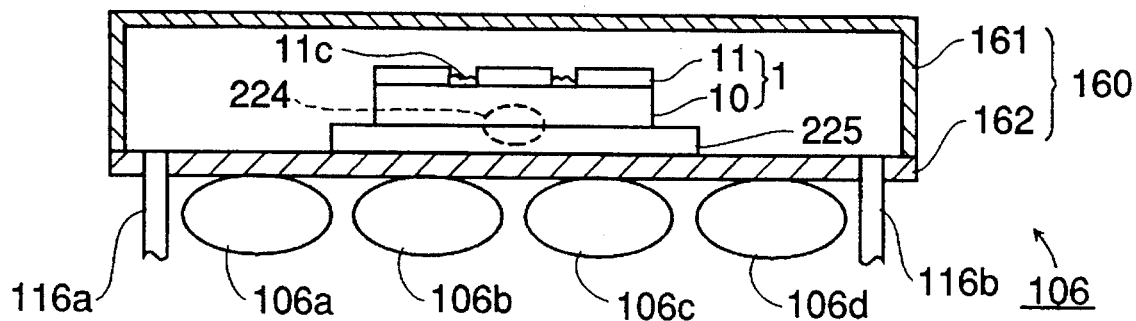
Figure 7:
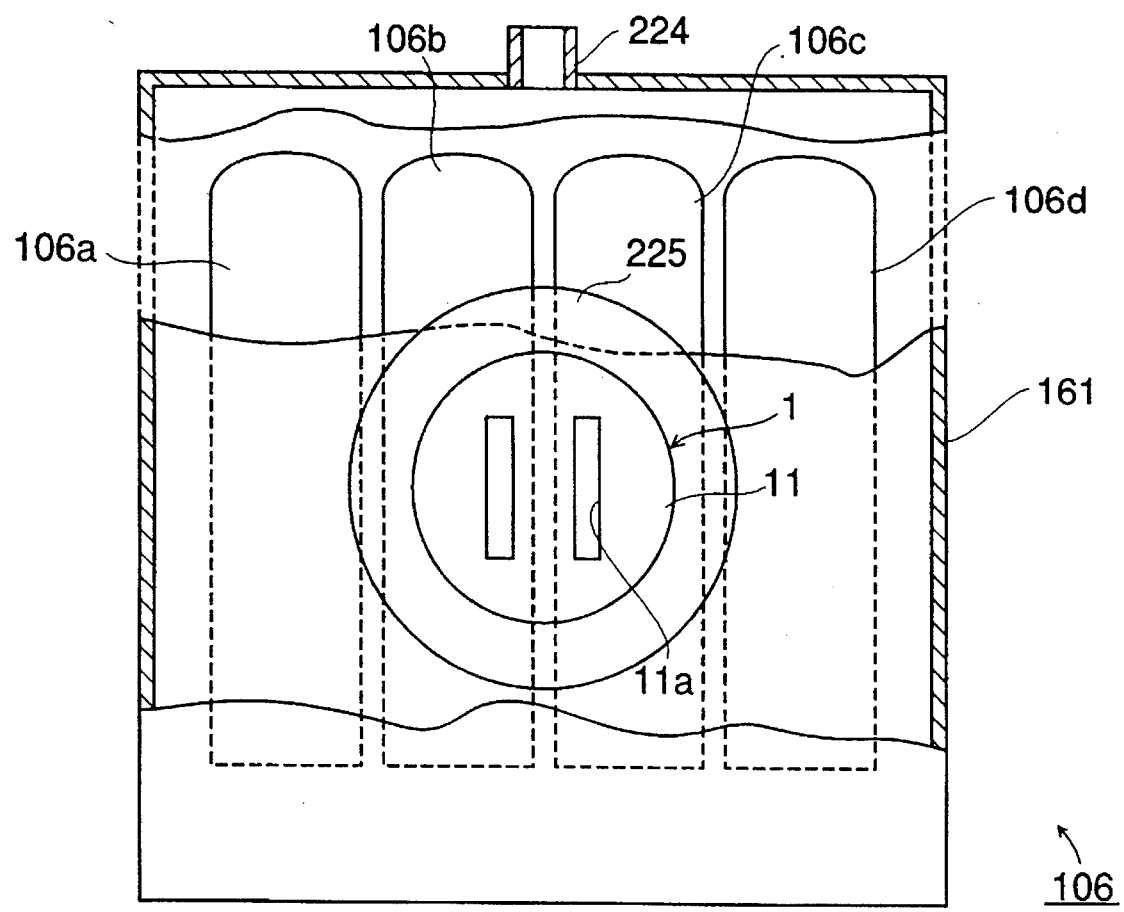

FIGS. 7(a)–7(b) are schematic views for describing a light ozone asher according to a sixth embodiment of the present invention, in which FIG. 7(a) is a sectional view thereof and FIG. 7(b) is a partially broken plan view thereof.

Referring to FIGS. 7(a)–7(b), the light ozone asher 106 of this sixth embodiment has a process chamber 160 in which an organic substance, such as a resist, is removed. The process chamber 160 comprises a process chamber body 161 made of metal, such as aluminum, and a bottom 162 made of quartz which transmits UV rays, and the sample stage 225 is disposed in the center of the bottom 162. In addition, according to this embodiment of the present invention, UV lamps 106a to 106d are disposed under the bottom 162 and ozone introducing pipes 116a and 116b are disposed on both edges of the bottom 162.

Then, function and effect will be described.

When ozone is introduced and the UV lamps 106 to 106d are lighted after the sample 1 from which the scum is to be removed is disposed in the process chamber 160, ozone introduced into the process chamber 160 absorbs UV rays and separates into oxygen and active oxygen. The generated active oxygen is diffused onto the sample 1 and reacts with the development scum 11c on the surface of the sample, whereby the development scum 11c is decomposed to carbon monoxide, carbon dioxide, and water vapor and removed.

At this time, since UV lamps are disposed under the sample stage 225, the sample surface is not irradiated with UV rays. Therefore, when the development scum is removed as in the first and second embodiments of the present invention, the resist film 11 does not change in quality and its pattern does not destroyed, whereby the reduction of the thickness of the resist film can be controlled to be under several nm.

Although the sample stage 225 is in contact with the bottom 162 of the process chamber 160 in the sixth embodiment of the present invention, the sample stage 225 may be disposed at a short distance from the bottom 162. In this case, the influence of heat from the UV lamps on the sample can be small.

In addition, although the UV lamps 106a to 106d are disposed over the whole surface of the bottom of the process chamber 160 in the above-described sixth embodiment of the present invention, the UV lamps under the sample stage 225 may be dispensed with. In this case, like the above-described case, the influence of heat from the UV lamps on the sample can be small.

Embodiment 7

Figure 8:
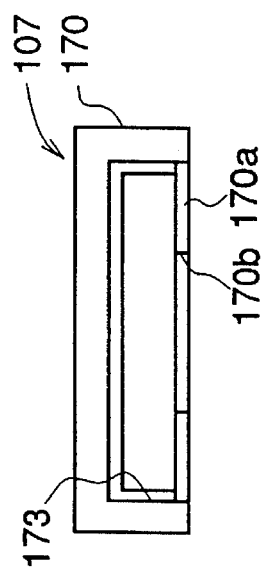
Figure 8:
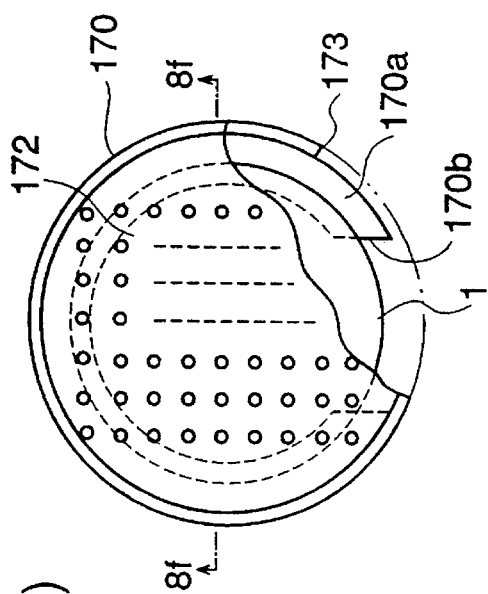
Figure 8:
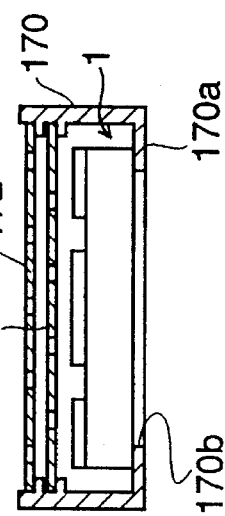
Figure 8:
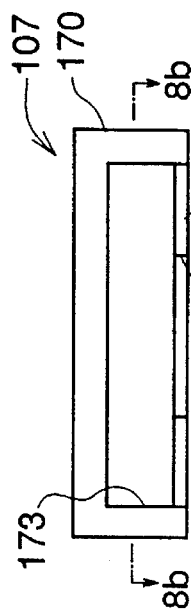
Figure 8:
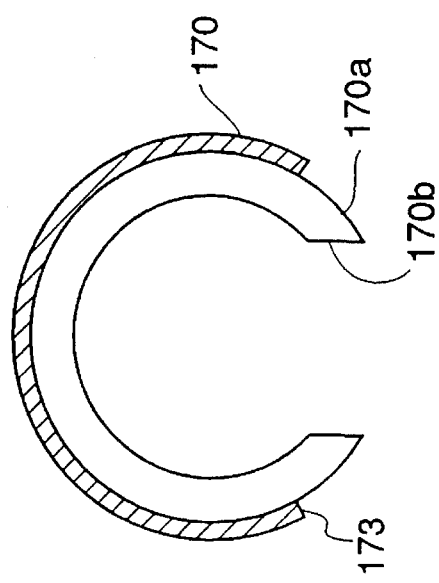
Figure 8:
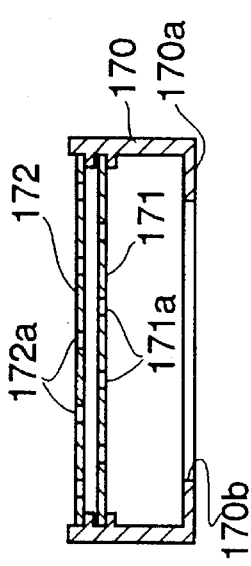

FIGS. 8(a)–8(f) are views for describing a light ashing method according to a seventh embodiment of the present invention, in which FIG. 8(a) is a front view showing a structure of a wafer holder used in the light ashing method, FIG. 8(b) is a sectional view taken along a line 8b—8b of FIG. 8(a), FIG. 8(c) is a vertical sectional view showing the holder, FIGS. 8(d) and 8(e) are a front view and a partially broken plan view showing the wafer housed in the holder, respectively, and FIG. 8(f) is a sectional view taken along a line 8f—8f of FIG. 8(e).

Referring to FIGS. 8(a)–8(f), a wafer holder (shielding fixture from UV rays) 107 used in the light ashing method according to this seventh embodiment comprises a cylindrical body 170 made of metal, such as aluminum, and upper and lower shielding plates 172 and 171 fitted in an upper portion of the cylindrical body 170. The shielding plates 172 and 171 are Pyrex plates having a plurality of holes 172a and 171a, respectively for the passage of gas and are disposed at a predetermined interval. In addition, since the holes 171a and 172a are disposed so as not overlap with each other, UV rays do not pass through the shielding plates.

In addition, a bottom flange 170a is formed at the lower portion of the cylindrical body 170 along its inner periphery, so that the wafer 1 can be put on the flange 170a. In addition, an opening 173 through which the wafer is inserted and withdrawn is formed at a part of the side of the cylindrical body 170, and a passage 170b for allowing a wafer transporting unit to pass is formed at a portion corresponding to the opening 173, in the flange 170a.

Then, a method for removing the scum on the wafer surface using the wafer holder will be described.

The wafer (sample) 1 produced through exposure and development of a resist is put in the wafer holder 107 by an automatic transportation unit and the wafer holder 107 having the wafer 1 is put on the sample stage 225 in the light ozone asher.

Figure 15:
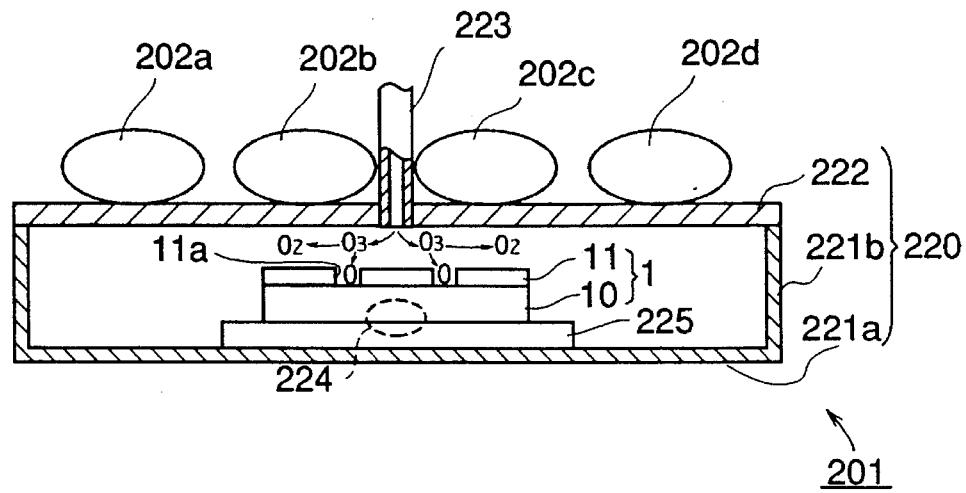
Figure 15:
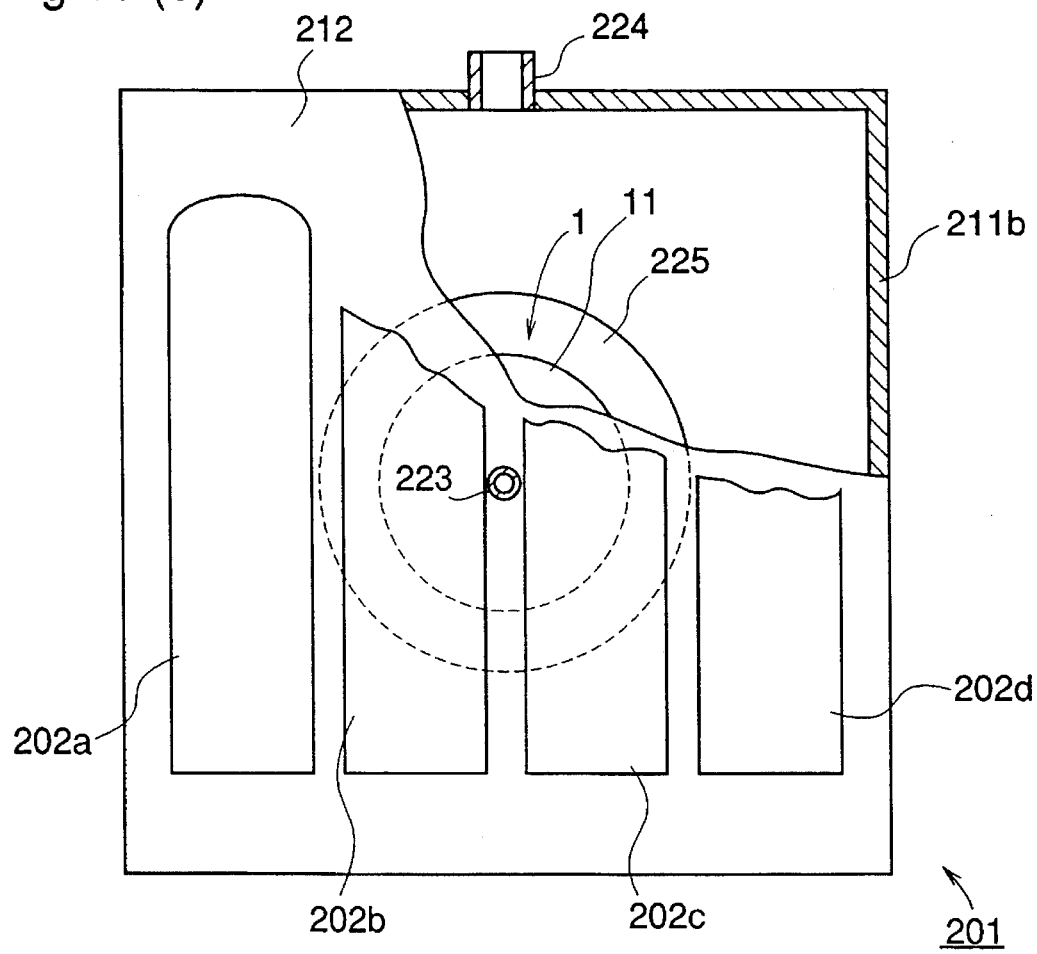
Figure 16:
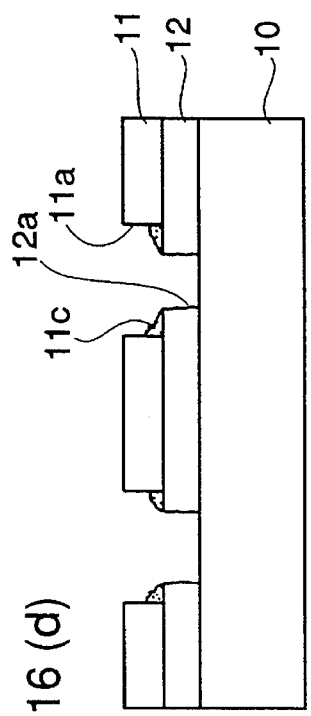
Figure 16:
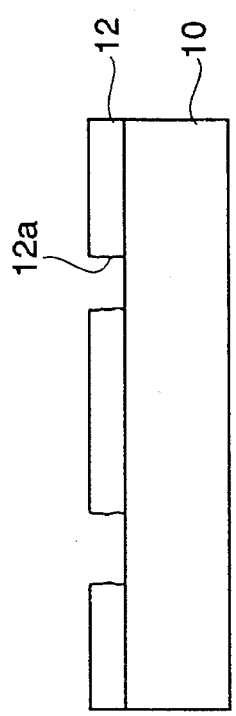
Figure 16:
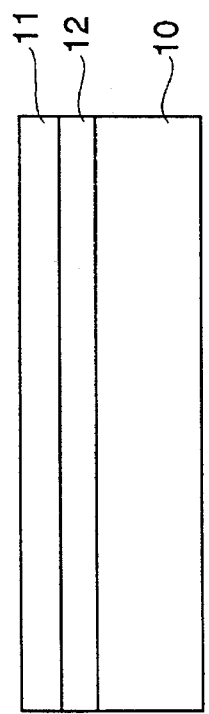
Figure 16:
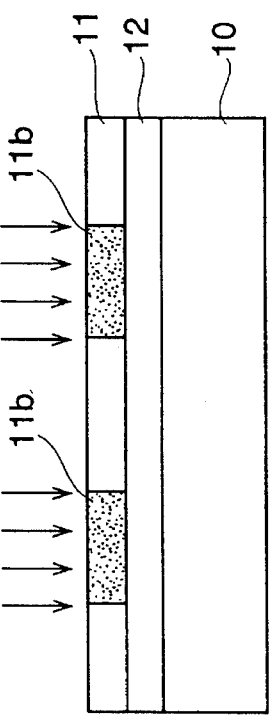
Figure 16:
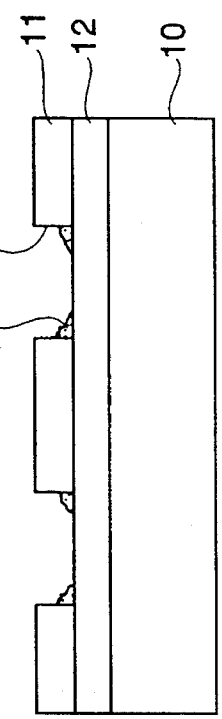
Figure 17:
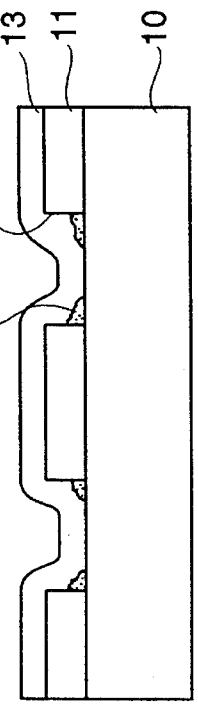
Figure 17:
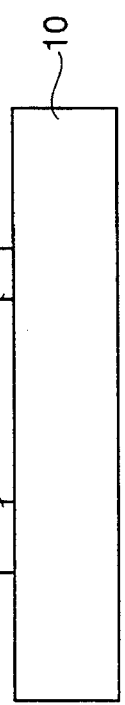
Figure 17:
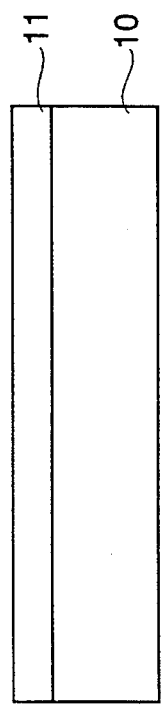
Figure 17:
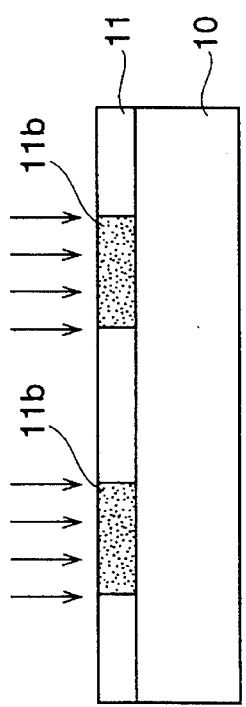
Figure 17:
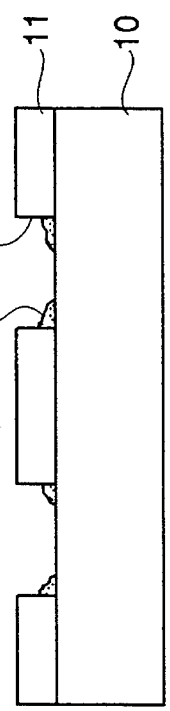
Figure 18:
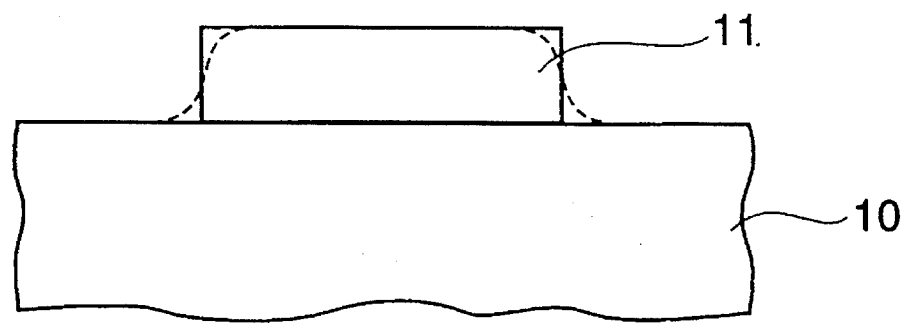
Figure 18:
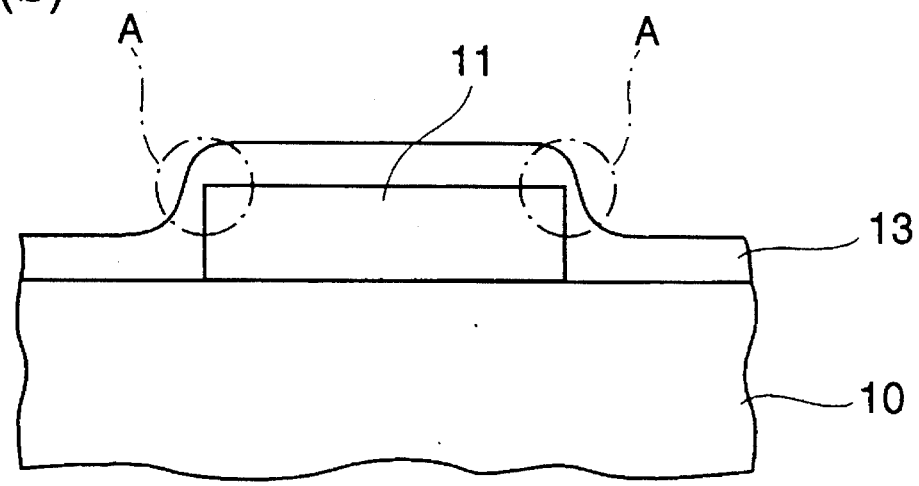

The light ozone asher is of the same structure as the conventional one shown in FIGS. 15(a)–15(b).

When ozone is introduced and UV lamps are lighted, ozone absorbs UV rays, whereby active oxygen is generated. Then, the active oxygen passes through the holes 172a and 171a of the second and first shielding plates 172 and 171 in the wafer holder 107 and it is diffused onto the sample 1, whereby the development scum on the surface of the sample is removed. At this time, since UV rays from the UV lamps are absorbed by the shielding plates 172 and 171 in the wafer holder 107, they do not reach the sample 1.

Thus, according to this seventh embodiment of the present invention, since the scum on the sample surface is removed in the light ozone asher when the sample is held in the wafer holder which does not transmit UV rays but allows gas to penetrate, the sample surface can be prevented from being irradiated with UV rays by the holder during UV irradiation, whereby the development scum of the resist can be removed without destroying the resist pattern. As a result, the scum can be removed in the conventional light ozone asher.

Embodiment 8

Figure 9:
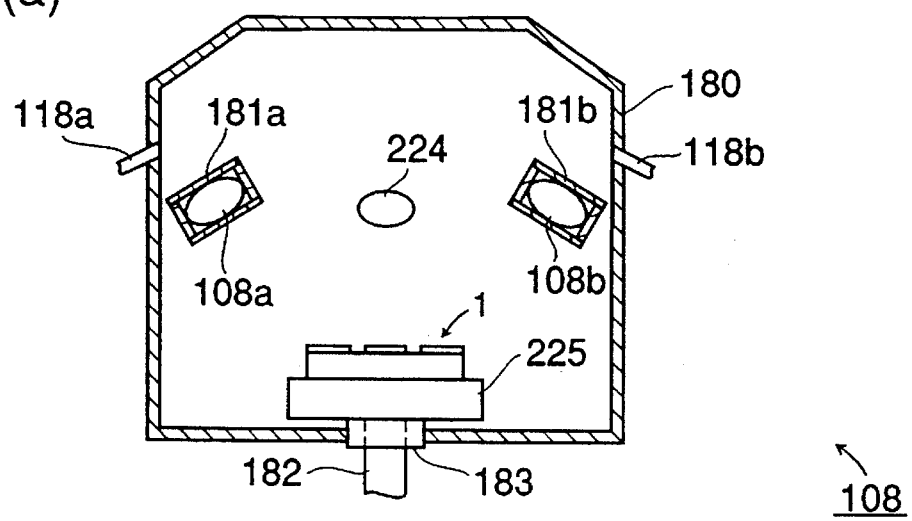
Figure 9:
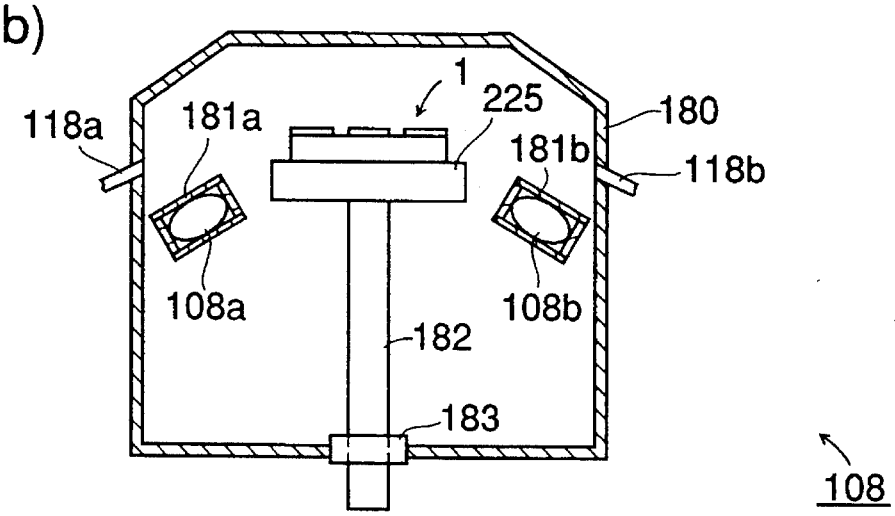
Figure 9:
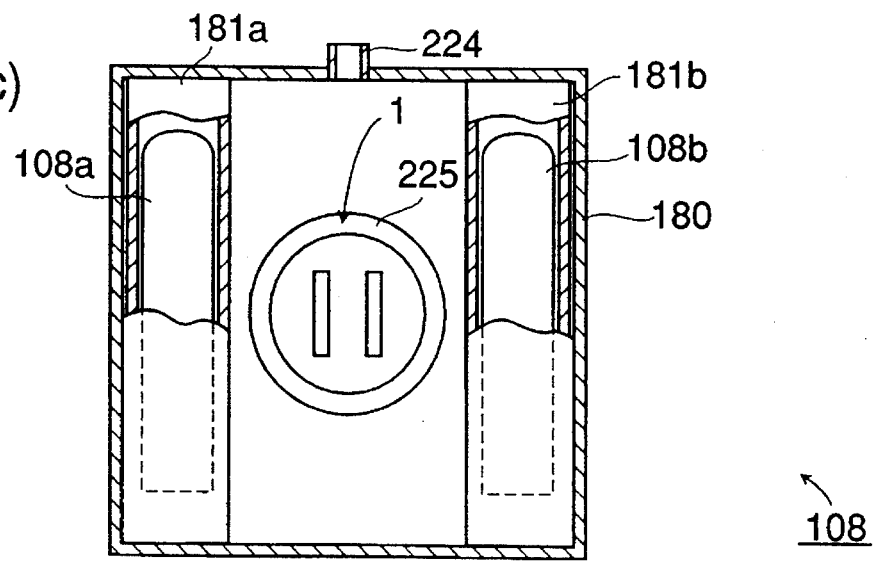

FIGS. 9(a)–9(c) are views for describing a light ozone asher according to an eighth embodiment of the present invention, in which FIG. 9(a) is a sectional view showing a state where UV cure is performed on the resist and FIGS. 9(b) and 9(c) are a sectional view and a plan view showing a state where the scum of the resist is removed, respectively.

Referring to FIGS. 9(a)–9(c), the light ozone asher 108 according to this eighth embodiment comprises a process chamber 180 in which the sample is processed. A lifting rod 182 is attached to the bottom of the process chamber 180 through a supporting member 183, and the sample stage 225 is connected to the end of the lifting rod 182. In addition, UV lamps 108a and 108b housed in the lamp housing cases 181a and 181b are disposed at upper both sides in the process chamber 180. The lamp housing cases 181a and 181b are fixed to the inner wall of the process chamber 180 such that the UV lamps are inclined at a predetermined angle. The left UV lamp 108a is inclined counterclockwise by 30 to 60 degrees from a position where UV rays are emitted in the vertical direction, and the right UV lamp 108b is inclined clockwise by 30 to 60 degrees from a position where UV rays are emitted in the vertical direction. In addition, ozone introducing pipes 118a and 118b are connected to the side wall of the process chamber 180 so as to be positioned higher than the lamp housing cases.

In this embodiment, the sample stage 225 connected to the lifting rod is positioned close to the bottom of the process chamber 180 at the time of UV cure of the resist film, and positioned at almost the same height as the right and left UV lamps 108a and 108b at the time of removal of the development scum of the resist film.

Then, function and effect will be described.

Figure 19:
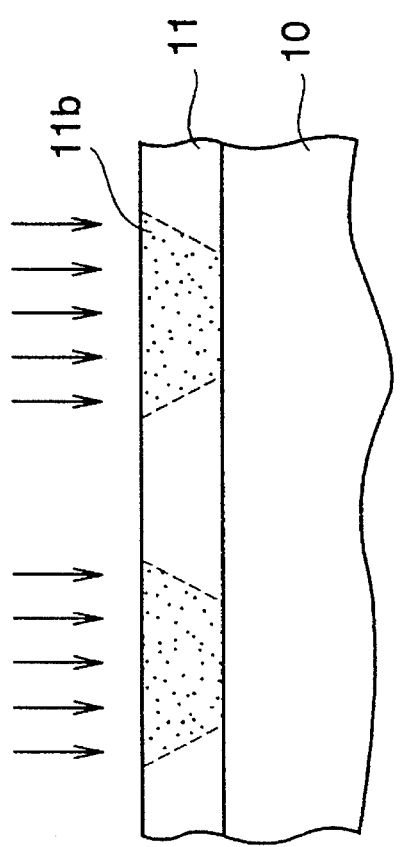
Figure 19:
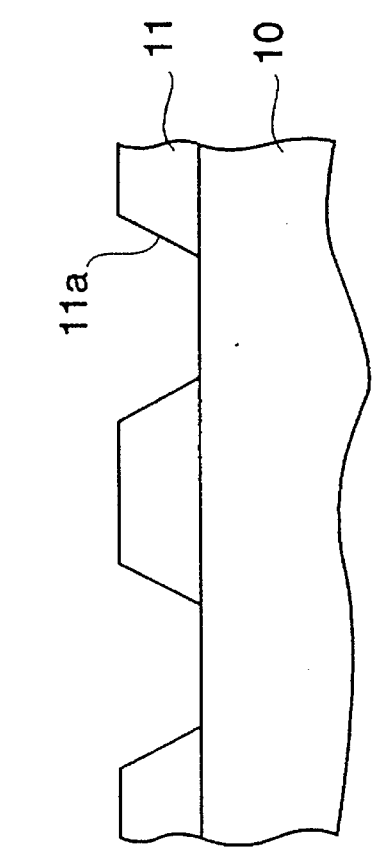
Figure 19:
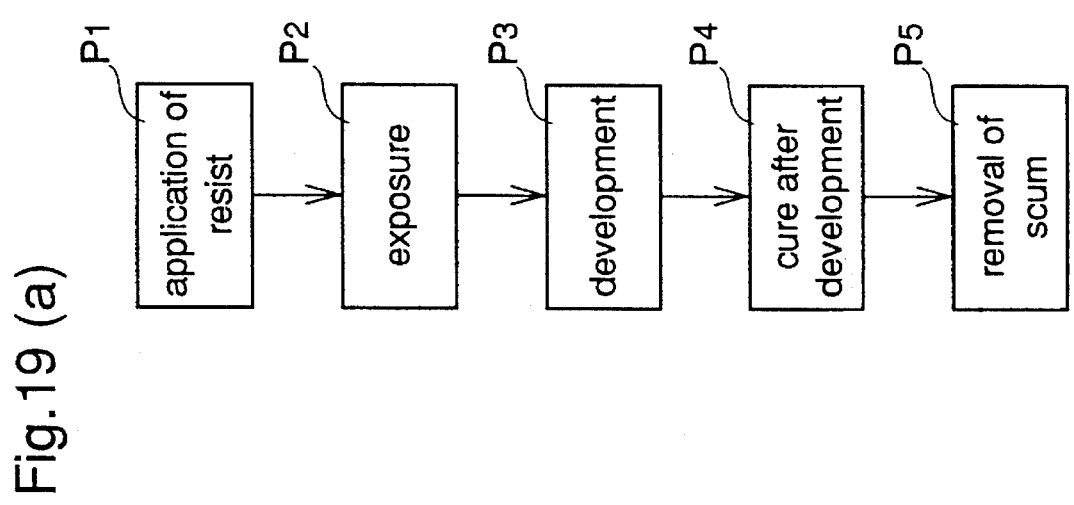

When the resist is patterned, as shown in FIG. 19(a), there are a step P1 in which a resist is applied onto a base, a step P2 in which the resist film is exposed, a step P3 in which the resist film is developed, a step P4 in which adhesive force with the base is increased by UV cure, and a step P5 in which the development scum is removed. FIG. 19(b) is a sectional view showing the step P2 and FIG. 19(c) is a sectional view showing the step P3.

In addition, in some cases, there is a step P3a in which a positive resist is converted to a negative resist by UV cure before development as shown in FIG. 20(a). Although the exposed part of the positive resist is usually removed by development, when the UV cure is performed before the development, the exposed part 11b is left by the development as shown in FIGS. 20(b) to 20(d).

Thus, when the resist is patterned, the UV cure is performed after the development in order to increase the adhesive force between the resist film and its base and the UV cure is performed before the development in order to convert the positive resist to the negative resist.

According to the light ozone asher of this eighth embodiment of the present invention, the UV cure after the development and the scum removal are continuously implemented, which will be described in detail hereinafter.

First, the sample 1 which was provided through exposure and development of a resist is put on the sample stage 225 positioned close to the bottom of the process chamber 180, and in this state, the UV lamps 108a and 108b are lighted at low power, approximately 30 W, for a predetermined period of time while ozone is not supplied (FIG. 9(a)). Thus, the UV cure after the development is performed, that is, the adhesive force with the base can be increased.

Then, the sample stage 225 is positioned at the same height as the UV lamps 108a and 108b by lifting the lifting rod 182, and in this state, the UV lamps 108a and 108b are lighted at a high power, approximately 140 W, for a predetermined period of time while ozone is supplied (FIGS. 9(b) and 9(c)). Then, ozone introduced into the process chamber absorbs UV rays from the UV lamps 108a and 108b and it is decomposed into active oxygen. The active oxygen reacts with the development scum on the surface of the sample on the stage 225. Thus, the development scum is decomposed to carbon monoxide, carbon dioxide, and water vapor and removed.

Thus, according to this eighth embodiment of the present invention, since the sample stage 225 is movable between the position in the vicinity of the bottom of the process chamber and the position at the same height as that of the UV lamps, the UV cure for the sample is performed at the position where the sample is irradiated with UV rays and the development scum on the sample is removed at the position where the sample is not irradiated with UV rays, whereby the UV cure and removal of the scum can be continuously implemented by one light ozone asher.

In addition, through the UV cure, the resist 11 absorbs UV rays, whereby resistance to etching is improved and adhesive force between the resist 11 and sample 1 is increased. In addition, since the sample 1 is separated from the UV lamps 108a and 108b and the power of the UV lamp 2 is lowered at the time of UV cure, the temperature of the sample 1 does not rise so that the resist pattern is not destroyed.

Meanwhile, although ozone generates a large amount of active oxygen from UV rays of 140 W at the time of removal of the development scum, since the sample 1 is positioned at the region which is not irradiated with UV rays, the temperature of the sample 1 does not rise, whereby the resist pattern is not destroyed and the development scum can be removed while the reduction in thickness of the resist film is controlled to be under several nm.

Embodiment 9

Figure 10:
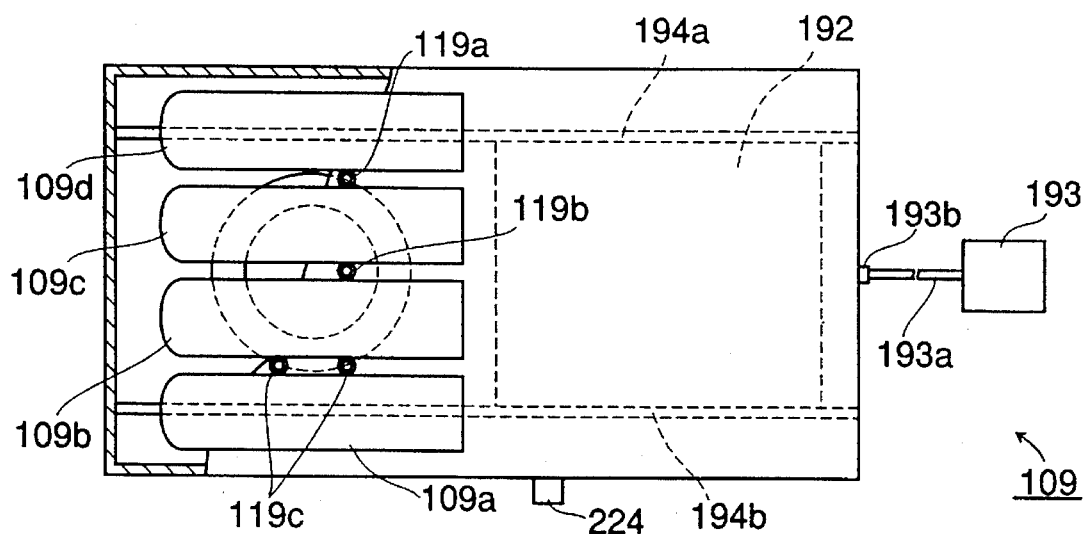
Figure 10:
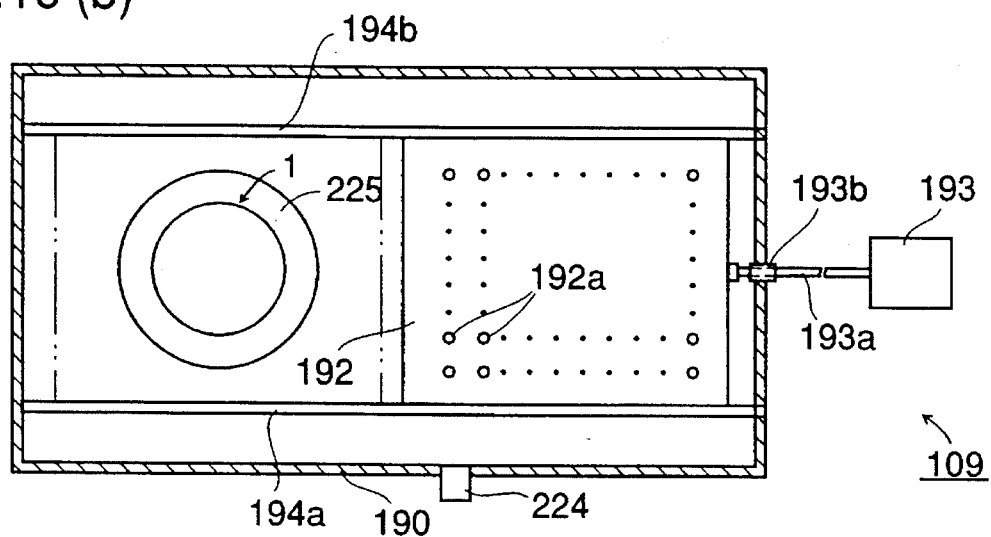
Figure 10:
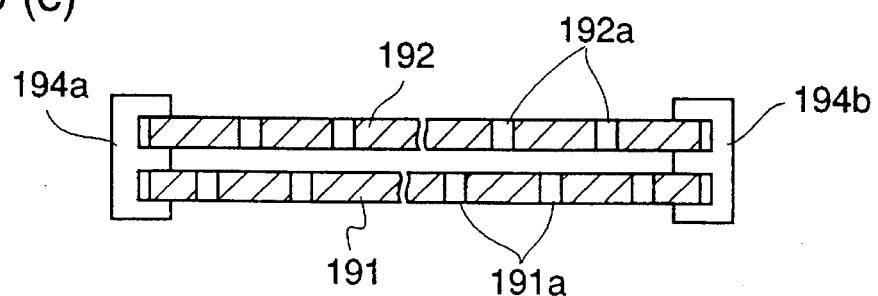

FIGS. 10(a)–10(c) are views for describing a light ozone asher according to a ninth embodiment of the present invention, in which FIG. 10(a) is a partially broken schematic view thereof, FIG. 10(b) is a plan view showing an inside structure of a process chamber, and FIG. 10(c) is a sectional view showing a structure of shielding plates.

Referring to FIGS. 10(a)–10(c), the light ozone asher 109 of this ninth embodiment comprises a rectangular process chamber 190 in which an organic substance is removed by active oxygen. The sample stage 225 is disposed on the left side of the process chamber and two shielding plates (Pyrex plates) 191 and 192 are movable between the left and right sides of the process chamber along guide members 194a and 194b. The shielding plates are connected to a driving unit 193 through a driving rod 193a, and the rod 193a is slidably held by a rod supporting member 193b. In addition, the shielding plates 191 and 192 have a plurality of holes 191a and 192b for the passage of gas, which are respectively arranged so as not to overlap with each other when both of the shielding plates are moved to a position above the sample on the stage 225. In addition, UV lamps 109a to 109d are disposed over the left upper side of the process chamber and ozone introducing pipes 119a to 119c are disposed between the adjacent UV lamps. In this ninth embodiment of the present invention, the distance between the UV lamps 109a to 109d and the sample 1 is also 1 to 2 cm as in the conventional apparatus.

Then, function and effect will be described.

According to the light ozone asher of this embodiment of the present invention, the above-described UV cure and removal of the scum are also continuously performed. Its process flow will be described in detail hereinafter.

First, the sample 1 provided through exposure and development of a resist is put on the sample stage 225 in the process chamber 190 and the UV lamps 109a to 109d are lighted at low power, approximately 30 W, for a predetermined period of time while ozone is not supplied and the shielding plates 191 and 192 are positioned on the right side of the process chamber, that is, with the sample surface is irradiated with UV rays. Thus, the UV cure of the resist after the development is performed, whereby the adhesive force with the base is increased.

Then, the UV lamps 109a to 109d are lighted at a high power, approximately 140 W, while ozone is supplied with the first and second shielding plates 191 and 192 positioned on the left side of the process chamber 190 by the driving unit 193 through the driving rod 193a, that is, the sample surface is not irradiated with UV rays. Then, ozone introduced into the process chamber absorbs UV rays from the UV lamps 109a to 109d and is decomposed to active oxygen, and the active oxygen passes through the holes 192a and 191a of the shielding plates 192 and 191. Then the active oxygen diffuses to the sample surface on the sample stage 225 and reacts with the development scum on the sample surface, whereby the development scum is decomposed to carbon monoxide, carbon dioxide, and water vapor and removed.

Thus, according to this ninth embodiment of the present invention, since the shielding plates 191 and 192 are provided so as to be movable between the position above the sample stage 225 and the position in the vicinity thereof, the same effect as that of the light ozone asher 108 according to the eighth of the present invention can be achieved.

Embodiment 10

Figure 11:
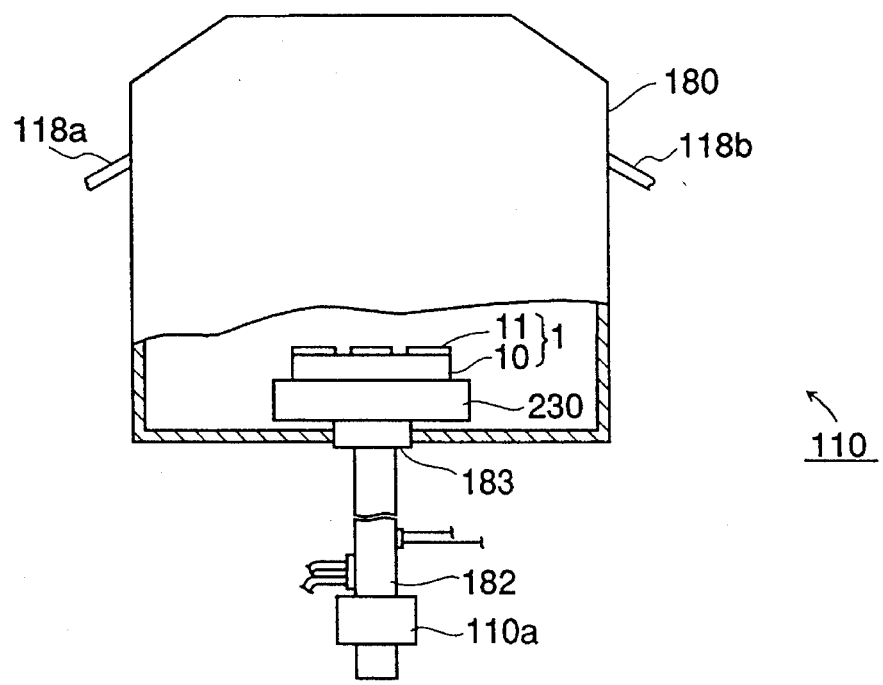
Figure 11:
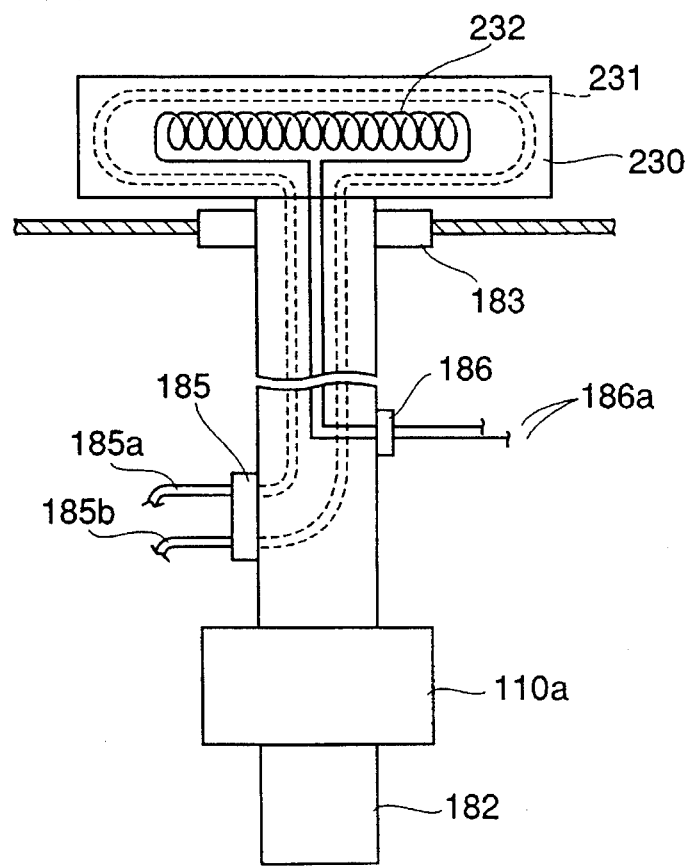

FIG. 11(a) is a schematic view for describing a light ozone asher according to a tenth embodiment of the present invention, and FIG. 11(b) is a view showing a structure of a sample stage thereof. Referring to FIGS. 11(a)–11(b), according to a sample stage 230 in the light ozone asher 110 of this tenth embodiment, a heater and a cooling mechanism are added to the sample stage in the light ozone asher according to the eighth embodiment of the present invention.

More specifically, the sample stage 230 comprises a cooling pipe 231 and a heating wire 232. The cooling pipe 231 is connected to a lower pipe connecting member 185 through a lifting rod 182. A water supply pipe 185a and a drain pipe 185b are connected to the pipe connecting member 185.

In addition, the heating wire 232 is connected to a wiring connector 186 through the lifting rod 182, and a feeder line 186a is connected to the wiring connector 186. The structure other than the above is the same as in the light ozone asher of the eighth embodiment of the present invention.

Then, function and effect will be described.

According to the light ozone asher of the above-described structure, the UV cure of the resist on the sample is performed while the sample stage 230 is usually kept at approximately 100° C. Then, when the development scum is removed, the sample stage 230 is cooled down to a stage temperature (70° C. or lower) by supplying cooling water into the cooling pipe 231. In this case, the cooling water is at almost the same temperature as that of the stage temperature. After the development scum is removed, water in the cooling pipe 231 is drained with $N_2$ gas. In addition, the stage is heated with the heater 232 and UV irradiation from the UV lamps.

According to this tenth embodiment of the present invention, since the cooling pipe 231 for cooling the sample stage 230 is provided, the sample stage 230 can be rapidly cooled down in addition to the effect of the eighth embodiment of the present invention.

Embodiment 11

Figure 12:
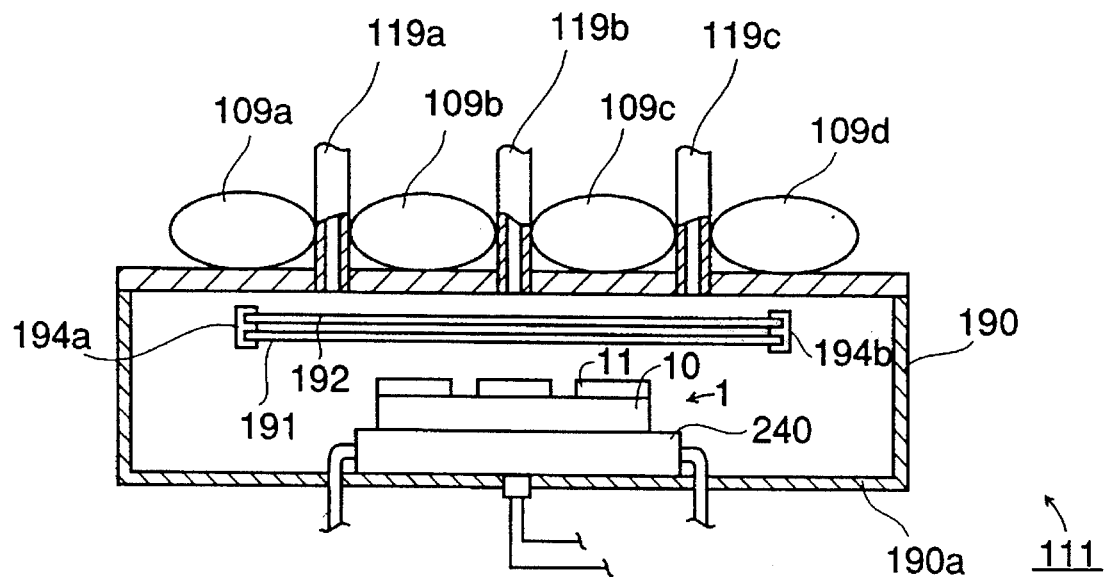
Figure 12:
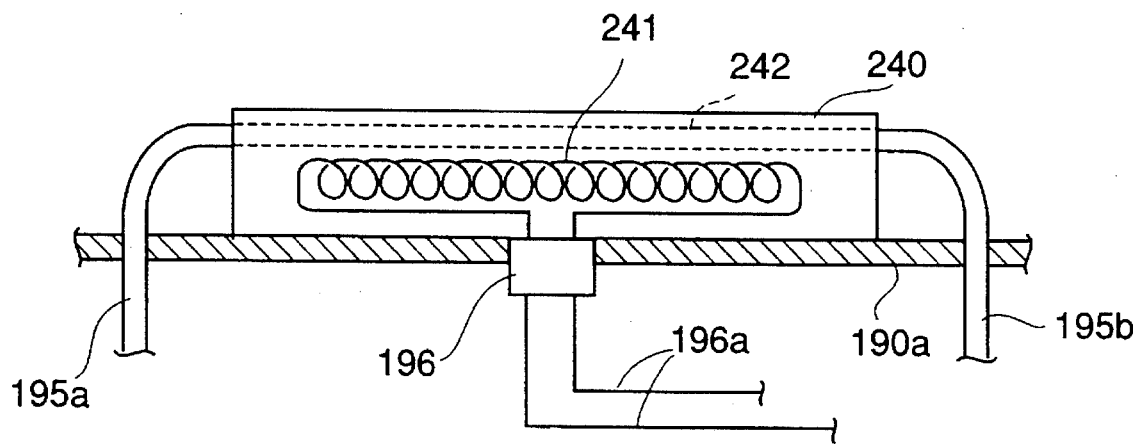

FIG. 12(a) is a schematic view for describing a light ozone asher according to an eleventh embodiment of the present invention and FIG. 12(b) is a view showing a structure of a sample stage therein. According to the sample stage 240 in the light ozone asher of this eleventh embodiment of the present invention, a heater and a cooling mechanism are added to the sample stage in the light ozone asher 110 according to the ninth embodiment of the present invention.

More specifically, the sample stage 240 comprises a cooling pipe 242 and a heating wire 241. One end of the cooling pipe 242 is connected to a water supply pipe 195a on the outside and the other end thereof is connected to a drain pipe 195b on the outside. In addition, the heating wire 241 is connected to a feed line 196a on the outside through a wiring connector 196 mounted to a bottom 190a of the process chamber 190. The structure other than the above is the same as that of the light ozone asher of the ninth embodiment of the present invention.

According to this eleventh embodiment of the present invention, like the tenth embodiment of the present invention, since the cooling pipe 242 is provided in the sample stage 240, there is provided an effect that the sample stage 240 can be rapidly cooled down in addition to the effect of the ninth embodiment of the present invention.

Embodiment 12

FIGS. 13(a)–13(f) are views for describing a manufacturing method of a semiconductor device according to a twelfth embodiment of the present invention. More specifically, FIGS. 13(a) to 13(f) show process steps for forming electrodes on a substrate. FIGS. 14(a)–14(b) are views for describing a structure of a light ozone asher used in the manufacturing method, in which FIG. 14(a) is a sectional view thereof and FIG. 14(b) is a plan view thereof.

Referring to FIGS. 13(a)–13(f), a resist film 11 is applied to a semiconductor substrate 10 comprising GaAs or the like, a resist opening 11a is formed by exposure and development of the resist film, a development scum 11c is left in the resist opening 11a, a metal layer 13 is formed on the whole surface of the patterned resist film, and electrodes 13b1 and 13b2 are formed by patterning the metal layer 13.

In addition, a light ozone asher 112 of this twelfth embodiment comprises a control circuit 250 for controlling the lighting of the UV lamps 202b and 202c just above the sample stage 225 and the UV lamps 202a and 202d on both sides thereof, separately. The structure other than the above is the same as that of the conventional light ozone asher 201.

Then, the manufacturing method of the semiconductor device will be described.

Figure 13:
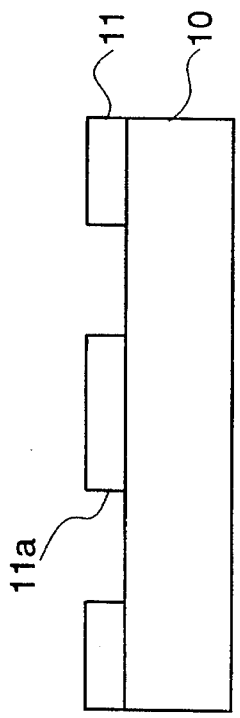
Figure 13:
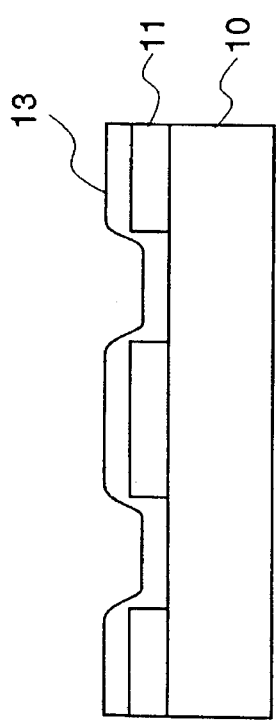
Figure 13:
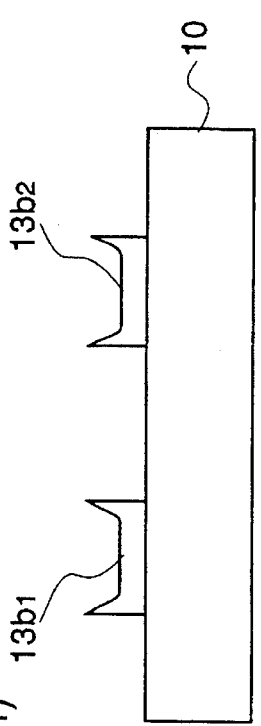
Figure 13:
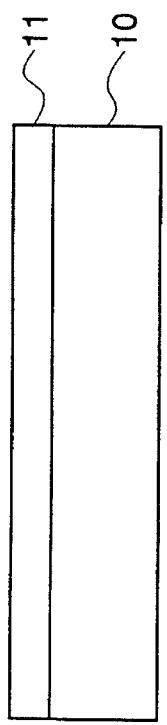
Figure 13:
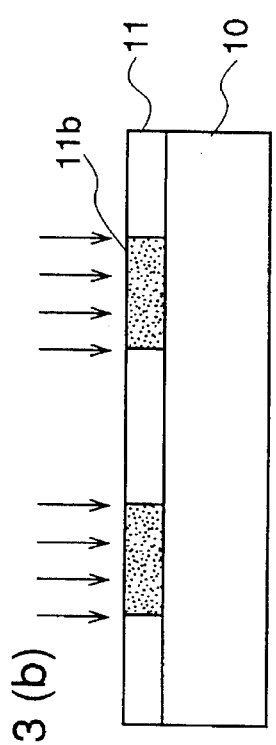
Figure 13:
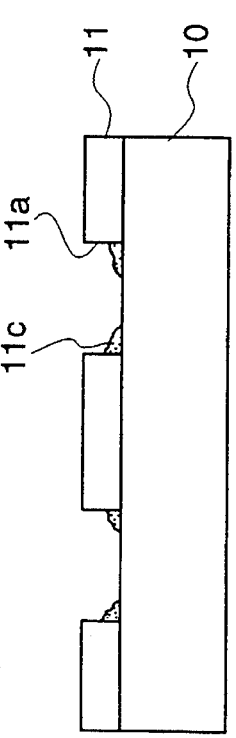
Figure 14:
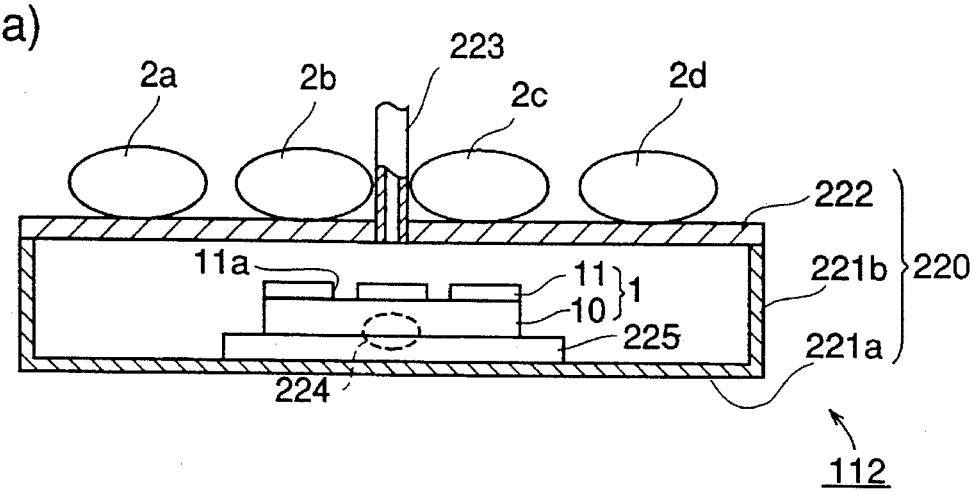
Figure 14:
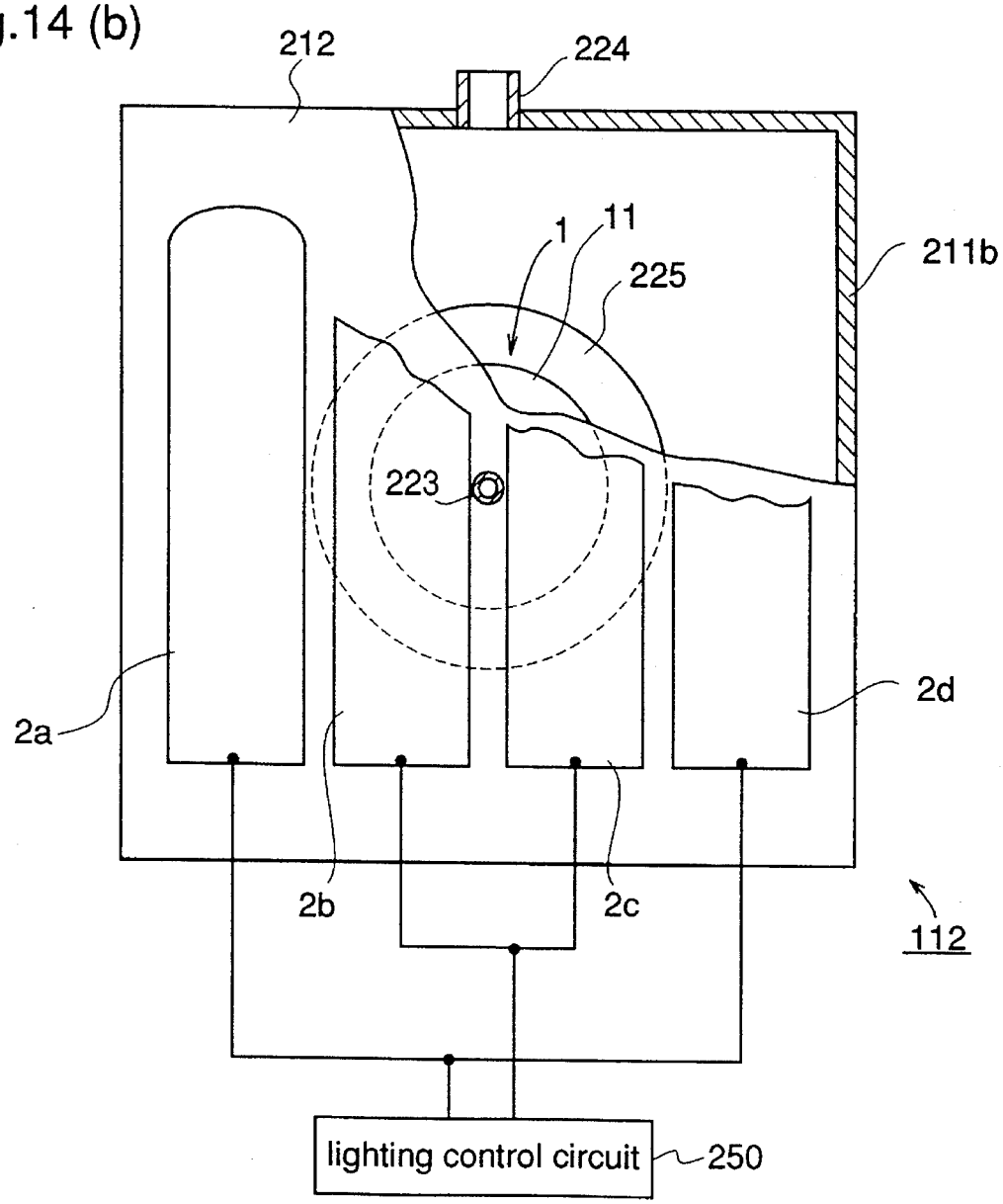

First, the resist film 11 is formed by applying a positive resist to the semiconductor substrate comprising GaAs or the like (FIG. 13(a)). Then, the resist film 11 is exposed (FIG. 13(b)) and the exposed part 11b is removed by development to pattern the resist film 11 (FIG. 13(c)). Then, the development scum 11c left in the removed part 11a of the resist film 11 is removed (FIG. 13(d)).

More specifically, the semiconductor substrate 10 provided through exposure and development of the resist is put on the sample stage 225 in the light ozone asher 201. Then, with the control circuit 250, the UV lamps 202a and 202d on both sides of the sample stage 225 are lighted while the UV lamps 202b and 202c just above the sample stage 225 are not lighted. In this state, ozone is introduced into the process chamber. Then, ozone in the process chamber 220 absorbs UV rays and separates to oxygen and active oxygen. The active oxygen is diffused onto the substrate 10 on the sample stage 225 and reacts with the development scum 11c on the substrate surface, whereby the development scum 11c is decomposed to carbon monoxide, carbon dioxide, and water vapor and removed. At this time, since the UV lamps 202b and 202c just above the sample stage 225 are not lighted, the sample stage 225 is not irradiated with UV rays.

Thereafter, an electrode material 13 is formed on the whole surface by vapor deposition (FIG. 13(e)) and the resist film is dissolved with solvent to lift off the electrode material thereon, whereby the electrodes 13b1 and 13b2 having a predetermined pattern are formed (FIG. 13(f)). Then, predetermined processing in which the electrode material and the substrate are alloyed and the protective film is formed is performed, whereby the semiconductor device is completed.

According to this twelfth embodiment of the present invention, since the development scum is removed after the exposure and development of the resist, the metal film is preferably lifted off using the resist film as a mask, whereby the patterning of the metal film is performed with high precision.

In addition, since the development scum is removed in the light ozone asher, damage applied to the semiconductor substrate serving as a base of the resist film is small as compared with a case where the development scum is removed by charged particles such as in a plasma asher.

In addition, since the UV lamps 202b and 202c positioned just above the sample stage 225 are not lighted but the UV lamps 202a and 202d positioned on both sides of the sample stage 225 are lighted by the control circuit 250 of the light ozone asher when the development scum of the resist is removed, the substrate surface is not irradiated with UV rays. Thus, when the scum is removed, the resist film 11 does not change in quality and its pattern configuration is not destroyed. In addition, the reduction in thickness of the resist film at the time of removal of the development scum can be controlled to be under several nm.

Although the metal film is patterned by lift-off in the above-described process of manufacturing a semiconductor device, a semiconductor layer or an insulating film may be patterned. Further, the patterning method may be selective etching instead of lift-off.

What is claimed is:

1. A light/ozone asher comprising:

a process chamber containing a sample stage for supporting and processing a sample with active oxygen generated by irradiating ozone with UV rays; and means for applying UV rays to the process chamber for generating active oxygen without irradiating a sample on the sample stage with UV rays.

2. The light/ozone asher according to claim 1 comprising pipes for introducing ozone into said process chamber and attached to parts of side walls of said process chamber such that ozone introduced into said process chamber passes through a region in the process chamber irradiated with UV rays and reaches a sample not irradiated with UV rays.

3. The light/ozone asher according to claim 2 wherein said means for applying UV rays comprises UV lamps disposed outside and on opposite sides of region directly opposite said sample stage.

4. The light/ozone asher according to claim 3 wherein each of said UV lamps has a section having an oval configuration through which UV rays are emitted only in the vertical direction.

5. The light/ozone asher according to claim 2 wherein said means for applying UV rays comprises a plurality of UV lamps disposed above said sample stage and shielding plates positioned between said UV lamps and said sample stage for preventing UV rays from reaching a sample on said stage.

6. The light/ozone asher according to claim 5 wherein said shielding plates comprise first and second shielding plates vertically disposed at a predetermined interval, said first shielding plate having a plurality of holes and said second shielding plate having a plurality of holes not overlapping with the holes in said first shielding plate.

7. The light/ozone asher according to claim 6 wherein said pipes for introducing ozone into said process chamber are disposed between adjacent UV lamps.

8. The light/ozone asher according to claim 1 wherein said process chamber comprises a first part in which active oxygen is generated by irradiating ozone with UV rays, a second part in which a sample is processed with active oxygen generated in the first part, and a partition plate made of a material that does not transmit UV rays disposed between and separating the first and second parts.

9. The light/ozone asher according to claim 1 wherein said process chamber comprises a first part in which active oxygen is generated by irradiating ozone with UV rays and a second part in which a sample is processed with active oxygen generated in the first part, and UV lamps disposed above the sample stage including a shielding film at lower sides of said UV lamps.

10. The light/ozone asher according to claim 9 wherein a coating material comprising an aromatic compound that absorbs UV rays is present on lower sides of said UV lamps.

11. The light/ozone asher according to claim 9 wherein a plated Ag layer that reflects UV rays is present on the lower sides of said UV lamps.

12. The light/ozone asher according to claim 1 wherein said means for applying UV rays comprises UV lamps disposed on both sides of said sample stage such that upper faces of said UV lamps are positioned lower than a sample on said stage.

13. The light/ozone asher according to claim 12 wherein said pipes for introducing ozone into said process chamber are mounted on said side walls of said process chamber so that ozone passes through a region irradiated with UV rays and reaches a sample not irradiated with UV rays.

14. The light/ozone asher according to claim 1 wherein said means for applying UV rays comprises a plurality of UV lamps disposed on an opposite side of said sample stage from a sample on said sample stage.

15. The light/ozone asher according to claim 14 wherein said pipes for introducing ozone into said process chamber are mounted on opposites sides of a bottom wall of said process chamber so that ozone passes through a region irradiated with UV rays and reaches a sample not irradiated with UV rays.

16. The light/ozone asher according to claim 1 wherein said sample stage is movable between a region in said chamber irradiated with UV rays and a region in said chamber not irradiated with UV rays, and including means for selectively lighting said UV lamps at a first, low power and at a second power higher than the first power.

17. The light/ozone asher according to claim 16 wherein:
said means for applying UV rays comprises UV lamps disposed in the vicinity of opposing side walls of said process chamber at a height so that only a region between the UV lamps is not irradiated with UV rays, and said pipes for introducing ozone into the process chamber are attached to said side walls of the process chamber at a position higher than said UV lamps so that ozone passes through the region irradiated with UV rays and reaches said sample stage at a position not irradiated with UV rays.

18. The light/ozone asher according to claim 5 wherein said shielding plates are movable between a first region between said UV lamps and said sample stage and a second region positioned beside said first region, and including means for selectively lighting said UV lamps at a first, low power and at a second power higher than the first power.

19. The light/ozone asher according to claim 16 wherein said sample stage comprises means for cooling and means for heating said sample stage.

20. The light/ozone asher according to claim 18 wherein said sample stage comprises means for cooling and means for heating said sample stage.

21. The light/ozone asher according to claim 2 wherein said means for applying UV rays comprises a plurality of UV lamps disposed above said sample stage and a control circuit for separately lighting the UV lamps positioned above said stage and the UV lamps on opposite sides of said stage.

22. A light/ozone ashing method comprising:
placing a sample on a sample holder in a process chamber of a light/ozone asher; and introducing ozone into said process chamber, generating active oxygen by irradiating the ozone with UV rays, without irradiating the sample with UV rays, and removing an organic substance from the sample with active oxygen that diffuses to said sample holder.

23. The light/ozone asher according to claim 22 wherein:
said sample holder comprises a metallic cylindrical body and upper and lower shielding plates that do not transmit UV rays fitted in said cylindrical body, and said upper shielding plate has a plurality of holes and said lower shielding plate has a plurality of holes wherein the holes in the upper shielding plate do not overlap the holes in the lower shielding plate.

24. A method of manufacturing a semiconductor device comprising:
selectively processing a surface of a sample; and generating active oxygen by irradiating ozone with UV rays and removing an organic substance on a region of the sample surface with active oxygen diffusing to the sample surface, wherein the sample surface is not irradiated with UV rays when the organic substance is removed.

* * * * *